US00RE47864E

(19) United States
(12) Reissued Patent
Swoboda

(10) Patent Number: US RE47,864 E
(45) Date of Reissued Patent: Feb. 18, 2020

(54) SERIES EQUIVALENT SCANS ACROSS MULTIPLE SCAN TOPOLOGIES

(71) Applicant: TEXAS INSTRUMENT INCORPORATED, Dallas, TX (US)

(72) Inventor: Gary L. Swoboda, Sugar Land, TX (US)

(73) Assignee: Texas Instruments Incorporated, Dallas, TX (US)

(21) Appl. No.: 13/946,990

(22) Filed: Jul. 19, 2013

Related U.S. Patent Documents

Reissue of:

(64) Patent No.: 7,984,348
Issued: Jul. 19, 2011
Appl. No.: 12/511,983
Filed: Jul. 29, 2009

U.S. Applications:

(60) Provisional application No. 61/084,474, filed on Jul. 29, 2008, provisional application No. 61/084,471, filed on Jul. 29, 2008, provisional application No. 61/084,463, filed on Jul. 29, 2008, provisional application No. 61/084,458, filed on Jul. 29, 2008, provisional application No. 61/084,453, filed on Jul.

(Continued)

(51) Int. Cl.

| | |
|---|---|
| ***G01R 31/28*** | (2006.01) |
| ***G01R 31/3185*** | (2006.01) |
| ***G01R 31/3177*** | (2006.01) |
| ***G01R 31/317*** | (2006.01) |
| *G06F 11/27* | (2006.01) |
| *G06F 11/36* | (2006.01) |
| *G06F 11/267* | (2006.01) |
| *H04L 12/26* | (2006.01) |

(52) U.S. Cl.
CPC . *G01R 31/318538* (2013.01); *G01R 31/3177* (2013.01); *G01R 31/31701* (2013.01); *G01R 31/31713* (2013.01); *G01R 31/31723* (2013.01); *G01R 31/31727* (2013.01); *G01R 31/318533* (2013.01); *G01R 31/318544* (2013.01); *G06F 11/267* (2013.01); *G06F 11/27* (2013.01); *G06F 11/3656* (2013.01); *G06F 2201/88* (2013.01); *H04L 43/50* (2013.01)

(58) Field of Classification Search
CPC ..... G01R 31/3177; G01R 31/318538; G01R 31/318544; G01R 31/31701; G01R 31/318533; G01R 31/3127; G01R 31/31723; G01R 31/31713; G01F 11/22; G01F 11/27; G01F 11/36; G01F 11/3656; G01F 11/267; G01F 2201/88; H04L 43/50
USPC ..... 714/727, 729, 715
See application file for complete search history.

(56) References Cited

U.S. PATENT DOCUMENTS

| | | | | |
|---|---|---|---|---|
| 5,606,566 | A * | 2/1997 | Whetsel | 714/729 |
| 6,311,302 | B1 * | 10/2001 | Cassetti et al. | 714/727 |
| 6,587,981 | B1 * | 7/2003 | Muradali et al. | 714/726 |

(Continued)

*Primary Examiner* — Matthew E Heneghan
(74) *Attorney, Agent, or Firm* — Charles A. Brill; Frank D. Cimino

(57) ABSTRACT

Performing series equivalent scans spanning a plurality of scan technologies in a complex scan topology may be performed by performing shift operations in the complex scan topology while only one branch of the complex scan topology connectivity is enabled, and performing capture and update operations in parallel while scan topology connectivity of two or more of the plurality of scan technologies is enabled.

12 Claims, 13 Drawing Sheets

Related U.S. Application Data

29, 2008, provisional application No. 61/084,439, filed on Jul. 29, 2008.

(56) References Cited

U.S. PATENT DOCUMENTS

| | | | | |
|---|---|---|---|---|
| 6,658,614 | B1 * | 12/2003 | Nagoya | 714/727 |
| 6,754,863 | B1 * | 6/2004 | Grannis, III | 714/729 |
| 6,925,410 | B2 * | 8/2005 | Narayanan | 702/150 |
| 7,047,458 | B2 * | 5/2006 | Nejedlo et al. | 714/715 |
| 7,675,900 | B1 * | 3/2010 | Parham et al. | 370/352 |
| 7,725,790 | B2 * | 5/2010 | Whetsel | 714/726 |
| 7,877,651 | B2 * | 1/2011 | Whetsel | 714/726 |
| 2006/0279439 | A1 * | 12/2006 | Swoboda | 341/60 |

* cited by examiner

2 OR 3 EDGES - AVAILABLE FOR CUSTOM USE OF ONLINE TECHNOLOGY

4 OR 5 EDGES - INITIATES DESELECTION OF A TECHNOLOGY

6 OR 7 EDGES - INITIATES SELECTION OF A TECHNOLOGY

8 OR MORE EDGES - ALL TECHNOLOGIES ARE RESET

SERIES EQUIVALENT SCANS ACROSS MULTIPLE SCAN TOPOLOGIES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CLAIM OF PRIORITY

The present application claims priority to and incorporates by reference U.S. Provisional Application No. 61/084,474 filed Jul. 29, 2008, entitled "Topology Discovery Training." The present application also claims priority to and incorporates by reference U.S. Provisional Application No. 61/084,471 filed Jul. 29, 2008, entitled "Series Equivalent Scans Across Multiple Scan Topologies." The present application also claims priority to and incorporates by reference U.S. Provisional Application No. 61/084,463 filed Jul. 29, 2008, entitled "Selecting a Scan Topology." The present application also claims priority to and incorporates by reference U.S. Provisional Application No. 61/084,458 filed Jul. 29, 2008, entitled "Automatic Scan Format Selection Based on Scan Topology Selection." The present application also claims priority to and incorporates by reference U.S. Provisional Application No. 61/084,453 filed Jul. 29, 2008, entitled "Dynamic Broadcast of Configuration Loads Supporting Multiple Transfer Formats." The present application also claims priority to and incorporates by reference U.S. Provisional Application No. 61/084,439 filed Jul. 29, 2008, entitled "Timing Protected Detection of Alternate Signaling Mechanism Using Clock and Data."

FIELD OF THE INVENTION

This invention generally relates to the field of testing integrated circuits and systems containing integrated circuits.

BACKGROUND OF THE INVENTION

The IEEE 1149.1 standard was adopted in 1990. Built upon the work of the Joint Test Action Group (JTAG), it provided a pins-out view from one IC pad to another to help test engineers locate and discover faulty PC boards. A description of the boundary scan description language was added in 1994.

Complications arose as chips increased functionality and designs shifted away from PC boards to multichip modules and stacked die packages. These difficulties included handling the pin count requirements and multiple Test Access Port (TAP) controllers for System-on-Chip (SoC) devices, testing multichip modules and stacked die configurations, enhancing debug performance, and improving test and debug logic power-down in low-power conditions.

Organizations like the Mobile Industry Processor Interface Alliance and the NEXUS 5001 Forum took up the challenge to solve the problems specific to their industries.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

As chips add new functionality and system designs evolve away from boards and toward multi-chip system-on-chip (SoC) architectures, developers of handheld and consumer electronics are faced with stricter pin and package constraints. The IEEE 1149.7 standard is a new two-pin test and debug interface standard that supports half the number of pins of the IEEE 1149.1 technology, allowing developers to easily test and debug products with complex digital circuitry, multiple CPUs and applications software in products such as mobile and handheld communication devices.

The IEEE 1149.7 is a complementary superset of the widely adopted IEEE 1149.1 (JTAG) standard that has been in use for more than two decades. This standard defines a port into embedded systems for device manufacturing, testing and software development during system development. In addition to maintaining compatibility with IEEE 1149.1, the new standard improves debug capabilities and reduces SoC pin-count requirements. It also standardizes power-saving conditions, simplifies manufacturing of multi-chip modules and stacked die devices, and provides the ability to transport instrumentation data. Concepts and terminology used in IEEE 1149.1 and in IEEE 1149.7 are used in a similar manner herein and are therefore not described in detail herein.

Rather than replacing IEEE 1149.1, the new IEEE 1149.7 standard expands its functionality while reducing the number of pins used in some configurations. It supports new scan topologies that are favorable to stacked die and multichip module configurations and offers advanced capabilities to aid in software debug. It describes circuitry that may be added to an integrated circuit to provide access to on-chip IEEE standard test access ports (TAPs) specified by IEEE Std 1149.1-2001. It provides complete backward compatibility with the 1149.1 standard while aggressively adding features to supporting applications test and debug. The circuitry uses IEEE Standard 1149.1-2001 as its foundation.

The 1149.7 Standard delivers these capabilities with six classes of test access ports (T0-T5), with each class providing incremental capability. The IEEE 1149.7 standard has two groups of capabilities: Classes T0 through T3, which extend IEEE 1149.1 and enable new operations using the IEEE 1149.1 protocol, and Classes T4 and T5, which are focused on advanced two-pin operation using an Advanced Protocol.

Figure 1:
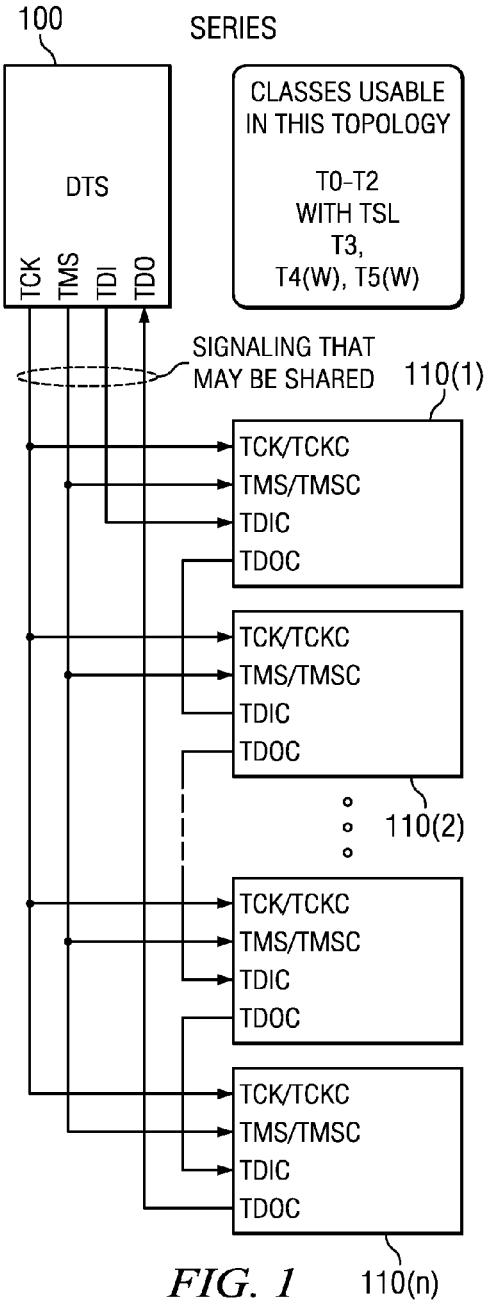
FIG. 1 is a block diagram illustrating a target system with series scan topology.

Class T0 ensures compliance with the industry's test infrastructure by setting up IEEE 1149.7 devices to make them act compatibly with IEEE 1149.1. These techniques include the use of N-bit IR, 1-bit DR for bypass instruction, mandatory IDCODE (32-bit path), and mandatory instructions behaving as specified in the IEEE 1149.1 specification. After a test logic reset is initiated, all multi-TAP devices must conform to the mandatory IEEE 1149.1 instruction behavior and implement a 1-bit DR scan for the bypass instruction. FIG. 1 illustrates such a system. Debug test system (DTS) 100 is generally a computer based system that provides control and a user interface for testing an integrated chip, printed circuit board or SoC using IEEE 1149.1 that has been enhanced to support the IEEE 1149.7 protocols. DTS 100 may be an XDS emulator from Texas Instruments, for example. Modules 110(1)-110(n) are representative of various modules that may be interconnected to DTS 100 using various aspects that will be described in more detail below.

Class T1 instantiates a control system for the IEEE 1149.7 standard that is transparent to IEEE 1149.1 devices, providing a foundation for the advanced functionality implemented in Classes T1 through T5 without changing the IEEE 1149.1 state machine. It supports standardized test and functional resets along with power management of the TAP controller and test logic.

Figure 2:
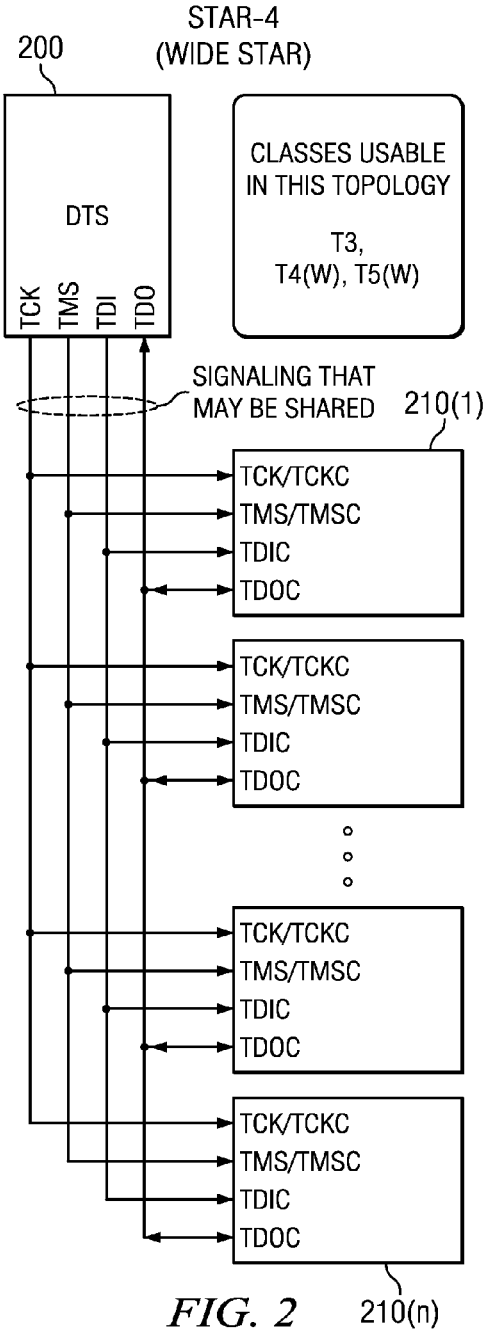
FIG. 2 is a block diagram illustrating a target system with four-wire star scan topology.

Class T2 offers a chip-level bypass mechanism that shortens scan paths and another mechanism that provides hot connect capability to achieve higher performance for testing high chip count applications, Class T3 provides for boundary scan testing using a four signal star topology (Star-4), with TAP selection built into the TAP.7 controller, unlike the use of a Star-4 Scan Topology described by the IEEE 1149.1 Standard. A T3 TAP may be deployed in either a series or star scan topology. A star topology may be preferred for testing stacked die configurations. Whereas FIG. 1 shows the series scan topology, FIG. 2 illustrates the Star-4 or Wide Star configuration. In this case, modules 210(1)-210(n) are connected in a parallel manner using four wires and may be connected to DTS 200 that is configured to provide control over a star connected system, as will be described in more detail below. Direct addressability is included with T3 and above TAP.7 controllers.

Class T4 provides a reduction of number of test and debug pins in SoC devices. It supports scan transactions with two pins instead of four, resulting in fewer total pins required on chip packages. This also helps with stacked die configurations because it is highly desirable to have debug pins connected in parallel when dies are stacked. Two-pin operation is provided by eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

To address the rising number of pins in SoC devices, Class T4 adds scan formats to support transactions with two pins instead of four, resulting in fewer total pins required on chip packages. This also helps with stacked die configurations because it is highly desirable to have the fewest number of connectors possible when die are stacked. The key to two-pin operation is eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

Besides reducing pin count, Class T4 defines optimized download-specific scan modes in which only useful information is downloaded. To improve pin operation performance, the clock rate also can be doubled. These features combined with the optimized transactions do not cause performance loss, instead improving performance in some cases.

Class T5 functionality is beneficial primarily to software designers utilizing a Test Access Port for debugging. This class gives the test port the ability to perform debug and instrumentation operations concurrently (data is transferred during idle time), which reduces the number of pins dedicated to instrumentation, and enables custom protocols to use the pins, a feature many vendors offer in nonstandard ways. Class T5 standardizes the process used to access the pins and provides both scan and data transport transactions using the two wire interface.

Figure 3:
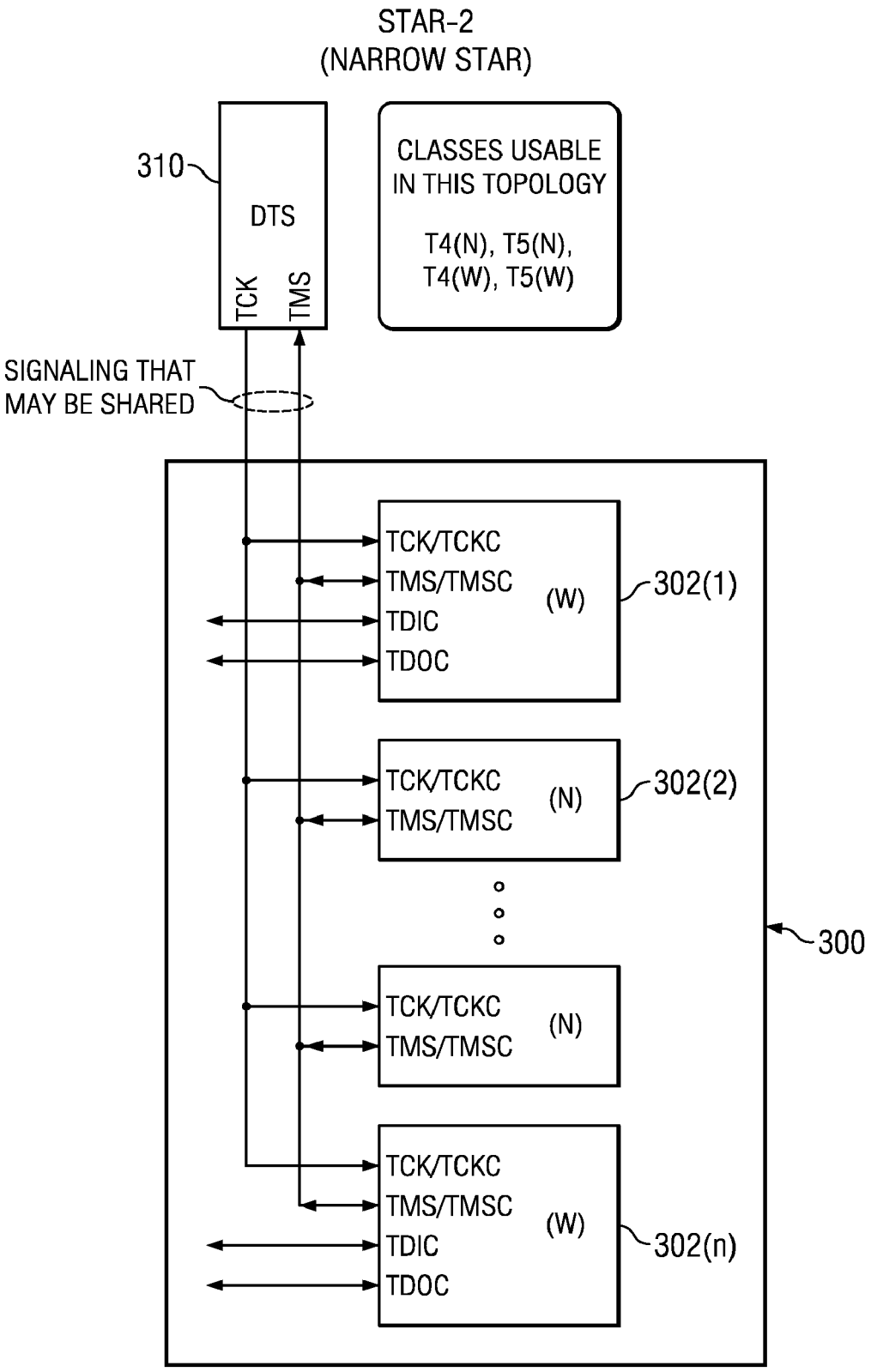
FIG. 3 is a block diagram illustrating a target system with two-wire star scan topology.

FIG. 3 also illustrates a debug test system (DTS) 310 coupled to SoC 300. DTS 310 is generally a computer based system that provides control and a user interface for testing an integrated chip, printed circuit board or SoC using IEEE 1147.1 that has been enhanced to support the IEEE 1147 protocols and two-wire interface, as will be described in more detail below. DTS 310 may be an XDS emulator from Texas Instruments, for example.

T0-T3, and T4/T5 four pin TAP.7s may be deployed in a Series Scan topology. T3 and T4/T5 four pin TAP.7s may be deployed in a Star-4 Scan topology. T4-T5 TAP.7s may be deployed in a Star-2 Scan Topology. When deployed in these scan topologies, all classes can traverse the state diagram using a common protocol (Standard—the legacy IEEE 1149.1 protocol). In the Series Scan Topologies data transfers to conventional 1149.1 instruction and data registers are performed with the Standard Protocol. In the Star-4 scan topology data transfers are performed with the Standard Protocol modified to prevent drive conflicts, with the ability to select the scan paths of only one TAP.7 controller in the topology at a time. This provides for sequential access to the paths of each TAP.7 controller in the branch. In the Star-2 scan topology, data transfers are performed only with the Advanced Protocol. The selection mechanisms for scan paths and TAPCs available with Star-4 operation are also available with Star-2 operation. Classes T0-T2 allow the use only the Standard Protocol, Class T3 allows the use of the Standard Protocol to traverse the TAPC state diagram and a modified Standard Protocol to either traverse the state diagram or perform data transfers in the Shift-IR and Shift-DR states. Classes T4 and T5 allow the use of the Standard Protocol to traverse the TAPC state diagram, a modified Standard Protocol to either traverse the state diagram or perform data transfers in the Shift-IR and Shift-DR states, when operated in a Star-4 Scan Topology, and Advanced Protocols to either traverse the state diagram or perform data transfers in the Shift-IR and Shift-DR states when operated in a Star-2 Scan Topology. It is important to note that with deployment in Star-4 and Star-2 topologies, TAP.7 controllers perform data transfers in these scan topologies using protocols unique to the topology in which they are deployed.

With Series Equivalent Scans, the selection of a single branch initiates the use of the protocol required to transfer data, while the selection of all branches initiates the use of the Standard Protocol since only traversing the state diagram is needed.

The operation of each of these Scan Topology Branches supports the selection of individual TAPCs and the scan paths associated with them during their independent operation. This is covered in the 1149.7 standard and not in this description.

TAP.7 architecture provides for the operation of Series, Star-4, and Star-2, Scan Topologies and other technologies sharing the TCK(C), TMS(C), TDI(C), and TDO(C) connections to a Debug Test System directing scan activity. These Scan Topologies are called branches of the system scan topology. With this architecture, an Adapter Test Access Port Controller (ADTAPC) is the gateway to scan facilities of a chip implementing an 1149.7 Test Access Port. The ADTAPC controls access to a Chip-Level Test Access Port Controller (CLTAPC) that provides access to chip-level scan paths Since a typical boundary scan operation requires scanning the instruction registers and boundary scan cells of one or more devices between the Select-xR and Update-xR states, a method is needed to duplicate the scan transaction available with a Series Scan topology when more than one scan topology is involved. With this description, states such as the Capture-xR and Update-xR TAP are to be interpreted as follows: the "x" refers to either "D" for data or "I" for instruction. Embodiments of the invention provide this equivalent function, a series equivalent scan.

Series equivalent scans of a complex scan topology, i.e., a scan topology with two or more branches in which at least two of the branches are of differing technologies (see Table 1), sharing the same control and data signaling create the equivalent of an 1149.1 series scan that begins with the Select-xR state and ends with the Update-xR state. With a series Scan Topology, all scan paths of interest are scanned at the same time between these states. With a complex scan topology, this is not possible as methods used to transfer data to and from scan paths presented by Series, Star-2, and Star-4 Scan Topologies and other technologies is different.

With series equivalent scans, a scan is broken into sections consisting of one or more scan sections. With an 1149.7 Test Access Port the scan section is one or more sequences of the Exit2-xR, one or more Shift-xR states, Exit1-xR, and one or more Pause-xR states). With another technology, scan data would be delivered as defined by the technology. These scan sections are sandwiched between a preamble (Select-xR, Capture-xR, Exit1-xR, and one or more Pause-DR states) and a postamble (Exit2-xR and Update-DR states). A single branch is selected between the preamble and the first scan section and between scan sections. All branches are selected between the last scan section and the postamble. With the sequence described above, all or some CLTAPCs in all branches progress from either the Test-Logic-Reset or Pause-xR state to the Pause-xR state without encountering an Shift-xR state. The TAPCs of all branches of interest operate in lockstep during the preamble and postamble state sequences, with only the TAPCs within branches that are selected during scan sections.

TABLE 1

Protocol usage by Technology

| TAPC | | Topology | Operation of Branches | | | |
|---|---|---|---|---|---|---|
| State | Protocol | Selected | Series | Star-4 | Star-2 | Other |
| Select-xR | Standard | All | Active | Active | Active | Active |
| Capture-xR | Standard | All | Active | Active | Active | Active |
| Exit 1-xR | Standard | All | Active | Active | Active | Active |
| Pause-xR | Standard | All | Active | Active | Active | Active |
| — | — | — | Select-Series. | | | |
| Pause-xR | Standard | Series | Active | Dormant | Dormant | Dormant |
| Exit2-xR | Standard | Series | Active | Dormant | Dormant | Dormant |
| Shift-xR | Standard | Series | Active | Dormant | Dormant | Dormant |
| Shift-xR | Standard | Series | Active | Dormant | Dormant | Dormant |
| Exitl-xR | Standard | Series | Active | Dormant | Dormant | Dormant |
| Pause-xR | Standard | Series | Active | Dormant | Dormant | Dormant |
| — | — | — | Select-Star-2 | | | |
| Pause-xR | Advanced | Star-2 | Dormant | Dormant | Active | Dormant |
| Exit2-xR | Advanced | Star-2 | Dormant | Dormant | Active | Dormant |
| Shift-xR | Advanced | Star-2 | Dormant | Dormant | Active | Dormant |
| Shift-xR | Advanced | Star-2 | Dormant | Dormant | Active | Dormant |
| Exit 1-xR | Advanced | Star-2 | Dormant | Dormant | Active | Dormant |
| Pause-xR | Advanced | Star-2 | Dormant | Dormant | Active | Dormant |
| — | — | — | Select-Star-4 | | | |
| Pause-xR | Modified Std | Star-4 | Dormant | Active | Dormant | Dormant |
| Exit2-xR | Modified Std | Star-4 | Dormant | Active | Dormant | Dormant |
| Shift-xR | Modified Std | Star-4 | Dormant | Active | Dormant | Dormant |
| Shift-xR | Modified Std | Star-4 | Dormant | Active | Dormant | Dormant |
| Exit 1-xR | Modified Std | Star-4 | Dormant | Active | Dormant | Dormant |
| Pause-xR | Modified Std | Star-4 | Dormant | Active | Dormant | Dormant |
| — | — | — | Select-Other | | | |
| Pause-xR | Tech. Defined | Other | Dormant | Dormant | Dormant | Active |
| Exit2-xR | Tech. Defined | Other | Dormant | Dormant | Dormant | Active |
| Shift-xR | Tech. Defined | Other | Dormant | Dormant | Dormant | Active |
| Shift-xR | Tech. Defined | Other | Dormant | Dormant | Dormant | Active |
| Exitl-xR | Tech. Defined | Other | Dormant | Dormant | Dormant | Active |
| Pause-xR | Tech. | Other | Dormant | Dormant | Dormant | Active |
| — | — | — | Select-All | | | |
| Pause-xR | Standard | All | Active | Active | Active | Active |
| Exit2-xR | Standard | All | Active | Active | Active | Active |
| Update-xR | Standard | All | Active | Active | Active | Active |

Figure 18A:
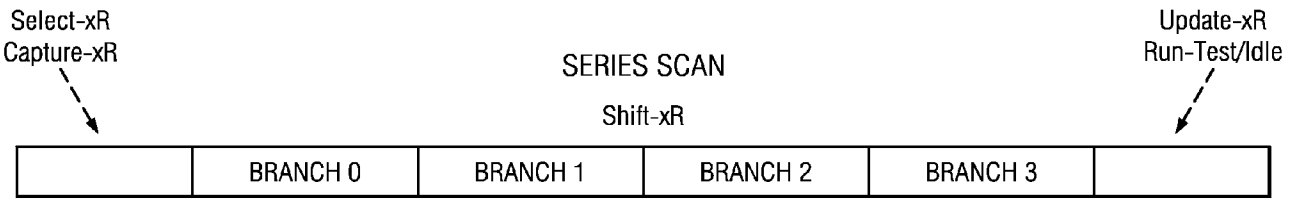
FIG. 18A illustrates a series scan.
Figure 18B:
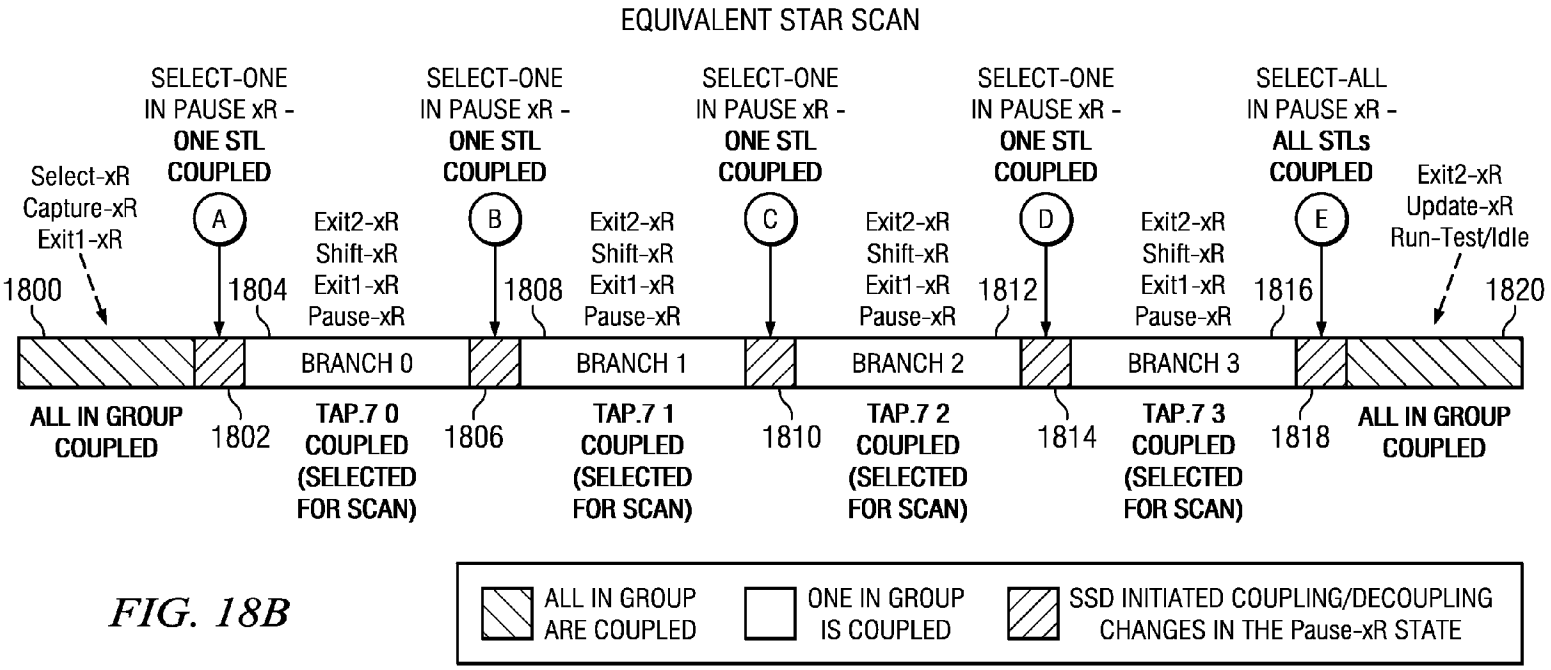
FIG. 18B illustrates a series equivalent scan in a star connected topology at the branch level.

FIG. 18A illustrates a series scan. A pictorial example of the scan in a Complex Scan Topology providing the equivalent function of a scan in a series scan topology is shown in FIG. 18B. This example has the four Technologies shown in Table 1.

Referring to FIG. 18B, the ADTAPC state of all four ATAPCs is moved to point A 1802 through the Capture-xR state to the Pause_xR state without an intervening Shift-xR state. Once the Pause-xR state is reached, a Selection Escape and subsequent selection sequence selects the ADTAPCs of a single TAP.7 branch while deselecting the ADTAPC of other TAP.7 controllers and technologies at points A 1804, B 1806, and C 1810. Between points 1802 and 1806, the scan paths of the first branch are scanned. Between points 1806 and 1810, the scan paths of the second branch are scanned. Between points 1810 and 1814, the scan paths of the third branch are scanned. Between points 1814 and 1818, the scan paths of the fourth branch are scanned, with this branch being another technology. Within sections 0-3, scan data is exchanged with the all of the CLTAPC controllers of interest within this branch. When the exchange of scan data with the last entity is completed, its state is returned to Pause-xR, as indicated at 1804, 1808, 1812, and 1816. When point 1818 is reached, all technologies, the scan is then completed by moving the CLTAPC state through the Update-DR TAPC state 1820. This process is used for both IR and DR Scans.

Table 1 lists various protocols that may be used with a Series Equivalent Scan. A protocol understood by the TAPCs of a selected branch is used to drive the state progression of a scan section. It is not necessary that the TAPCs forming a deselected branch understand the protocol used during this state progression. Scan operations are performed on the selected branch while the other branches remain dormant. Branches that are not selected remain dormant and ignore the protocol being used until they are selected. Once all branches are selected following the last scan section, the TAP controllers forming all branches move through the Update-xR and Capture-xR states in lock step. This provides the function of a series scan.

In summary, a scan of the paths with a branch move the state of the TAPCs forming the branch to Pause-xR, sequentially selecting and scanning the scan paths of interest within each branch beginning and ending the scans in the Pause-xR state. Once these scans are complete, the update/capture operation is performed simultaneously in all TAPCs of all branches of interest The TAPC state may be moved from the Update-xR state to either the Run-Test/Idle state or Select-DR state on to the Pause-xR state where the sequential scans can again be performed. This process preserves the timing between the Update-xR and Capture-DR states when portion of the operation that does not include the Shift-xR state is performed using the Standard Protocol.

The Run-Test-Idle state may also be used to select branches. This capability can be used to select a branch and park the state of one or more of the TAPCs forming the branch. This may be sequentially done for all branches. Only those TAPCs within a branch that are not parked may leave the Run-Test-Idle state. When all branches are selected and the TAPC state moved to the Pause-DR state via the Select-DR state. The TAPCs whose state is parked in Run-Test-Idle state do not participate in the scans.

A Selection Escape Sequence is used to initiate a selection sequence. This sequence can select all ADTAPCs within a branch while deselection all ADTAPCs within other branches or select all ADTAPCs within all branches. A deselection escape sequence deselects all ADTAPCs of all branches. Although selection and deselection escapes can be associated with any ADTAPC state, they are expected to be used while in the Pause-xR and Run-Test-Idle states. This process will be described in more detail below.

DTS/TS Connectivity

The TAP.7 architecture supports both simple and complex system connectivity with a graduated set of capability. A system may deploy any mix of TAP.1s, TAP.7s, and potentially other legacy technologies as shown in FIG. 4, which is a block diagram of a target system with mixed use of technologies and scan topologies.

Most systems will implement only one branch of the connectivity shown in this figure. In most cases, the target system (TS) will only have a limited number of TAPs. Other architectures, represented by branches 406, 407, can also be included as additional branches that are separate from those shown in FIG. 4 in a custom scan topology. These branches are controlled in manner similar to TAP.7 branches.

Technology Branches

Figure 4:
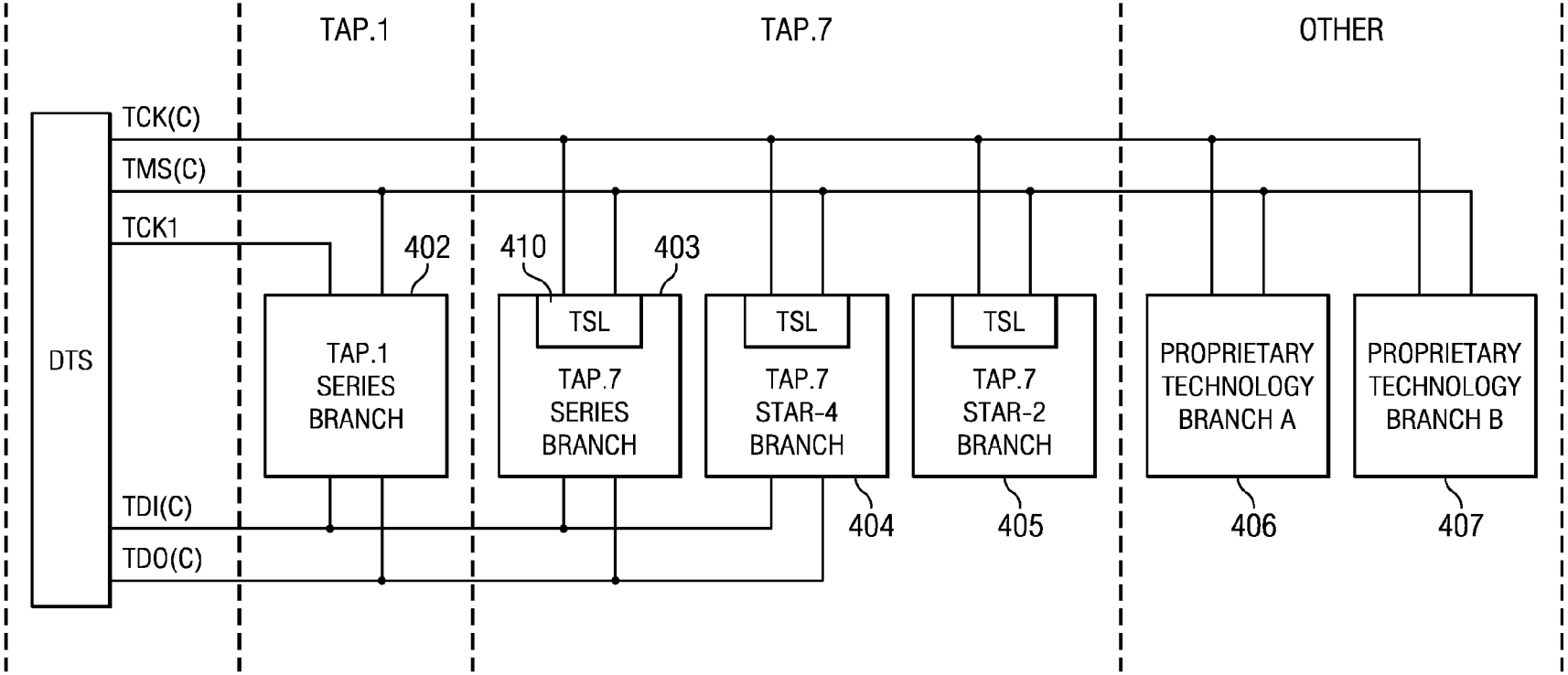
FIG. 4 is a block diagram of a target system with mixed use of technologies and scan topologies.

FIG. 4 is the union of simpler types of connectivity called technology branches. Each of the branches 402-407 shown in this figure may be operated separately for debug purposes. They may also be operated in a manner that provides Series Scan Equivalency across the branches controlled with the TCK1 and TCK(C) signals. Proprietary technologies are generally operated separately but may be operated with TAP.7 controllers in as shown in Table 1.

Other embodiments may have various combinations of branch operation. Other embodiments may use different sets of commands, protocols, events, etc. The list of protocols in Table 1 is not intended to be limiting to embodiments of the invention in any manner.

The TAP.7 branches 403-405 have one or more TAP.7s connected in Series, Star-4, and Star-2 Scan Topologies. These branches contain logic to select or deselect an ADTAPC, indicated generally at 410. This logic provides for the selection and deselection of these branches with Selection and Deselection Escape Sequences. ADTAPC selection logic is optional for T0-T2 TAP.7s and mandatory for T3 and above TAP.7s. Including this logic in TO-T2 TAP.7s supports their deployment in systems where T4(N) and T5(N) TAP.7s may be deployed.

The TAP.1 branch 402 includes a TAP.1 or a T0-T2 TAP.7 without technology selection logic connected in series with other TAP.1s or TAP.7s. It operates with the standard protocol and TAPs with the four 1149.1 signals. This branch is selected using the TCK1 signal shown in this figure as it has no built-in selection mechanism. T0-T2 TAP.7s without selection are included in a branch that is this type. The ADTAPC selection logic may be added to the current 1149.1 technology to make it selectable using common connectivity.

Proprietary technologies 406, 407 may be connected in parallel with the TAP.7 branches provided: the technology has a dedicated clock and at least one control/data input; the technology implements the technology selection mechanisms and protocols defined by the 1149.7 standard; and the clock pin of the technology is connected to the TCK(C) signal and the control/data pin is connected to the TMS(C) signal.

As noted previously, a TAP.1 branch is selected by keeping its TCK or TMS signal separated from the signal of like name of branches and gating one of the separate signals to deselect the branch. The gating of the TCK signal of this type of branch may be used for selecting these types of branches. TAP.1s and T0-T2 TAP.7s without the Technology Selection Logic (TSL) may be selected using this method. Any branch may be selected using this method if desired.

TAP.1s and TAP.7s can be deployed in topology branches as shown in Table 2. Each of these topologies is considered a technology within this document.

TABLE 2

Branch/technology deployment permissibility

| Branch | Proprietary | TAP.1 | T0-T2 w/o TSL | T0-T2 w/ TSL | T3 | T4 (W) | T5 (W) | T4 (N) | T5 (N) |
|---|---|---|---|---|---|---|---|---|---|
| TAP.1 Series | No | Yes | Yes | Yes | Yes | Yes | Yes | No | No |
| TAP.7 Series | No | No | No | Yes | Yes | Yes | Yes | No | No |
| TAP.7 Star-4 | No | No | No | No | Yes | Yes | Yes | No | No |
| TAP.7 Star-2 | No | No | No | No | No | Yes | Yes | Yes | Yes |
| Proprietary | Yes | No | No | No | No | No | No | No | No |

Chips, Components and Boards

With the TAP.7 architecture, any part of the connectivity shown in FIG. 4 may be deployed on a board, within a package, or within a chip. This comprehends the packaging and integration trends since the inception of the 1149.1 Standard.

The IEEE 1149.1 test view allows only one TAPC per component. The 1149.7 test view is a superset that allows multiple TAPCs per component. With the 1149.7 test view a component: is either a package containing one or more chips, or a direct mount chip; provides access to one or more TAP.1 or TAP.7 controllers through the same or separate pins; and provides access to proprietary TAPCs or other technologies through the same or separate pins.

Figure 5:
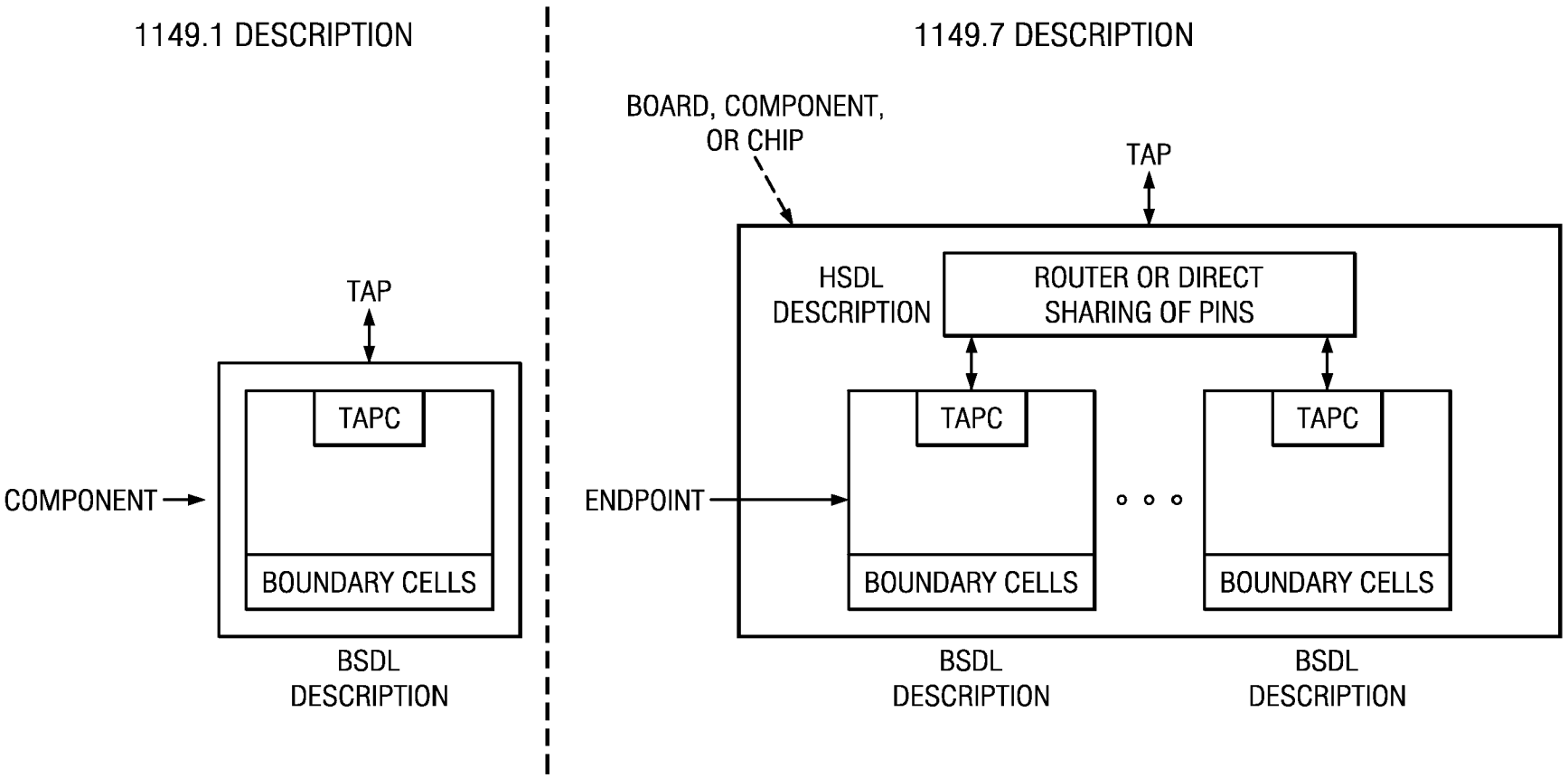
FIG. 5 is an illustration contrasting 1149.1 and 1149.7 test views.

This superset blurs the boundary between board, component, and chip. This blurring allows operation across those boundaries as shown in FIG. 5. When there is only one TAPC per component, the 1149.1 and 1149.7 test views are described by boundary scan description language (BSDL). When there is more than one TAPC per component the 1149.7 test view requires hierarchical scan description language (HSDL), plus BSDL for each endpoint.

TAP.7 Deployment Scenarios

Figure 6:
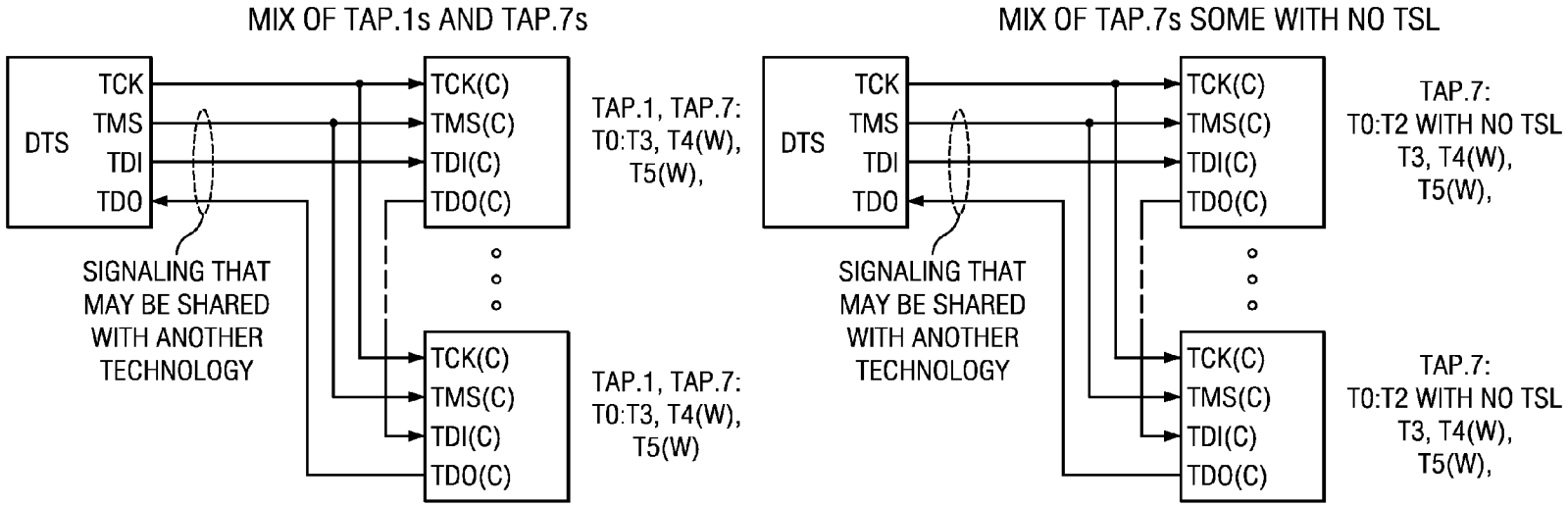
FIG. 6 is a series topology with mix of TAP.7s plus TAP.1s or TAP.7s with no TSL.

Series branches may be constructed from TAP.1s and four pin TAP.7s as shown in FIG. 6. This scan topology may share the TMS, TDI, and TDO connectivity with another topology provided a TCK(C) or TMS(C) signal is used to select/deselect this topology.

In most cases, one or more TAP.7s is connected in one of the Scan Topologies shown in FIGS. 1-3. Note that the convention for naming DTS TDI/TDIC and DTS TDO/TDO signals in FIGS. 1-3 is: 1) The DTS TDI/TDIC signal sources chip TDI information; 2) The DTS TDO/TDOC signal is the destination for chip TDO information.

The Star-2 Scan Topology illustrated in FIG. 3 is a subset of both the Series and Star-4 Scan Topologies. This means that the Series and Wide Star Scan Topologies may be operated as a Star-2 Scan Topology when every test access port sharing the connection is a T4 and above TAP.7.

Chip TAPC Hierarchy

A hierarchical view of TAPCs within a chip is needed to maintain IEEE 1149.1 compliance and provide solutions to the compatibility requirements identified earlier. For a given chip, three or more levels of TAPC hierarchy are accommodated as follows:

$1^{st}$ level—a TAPC within the TAP.7 controller—the primary interface to the DTS.

$2^{nd}$ level—a TAPC at the chip-level (CLTAPC).

$3^{rd}$ level—embedded TAPCs connected to the chip-level TAPC.

Other levels, if needed.

Figure 10:
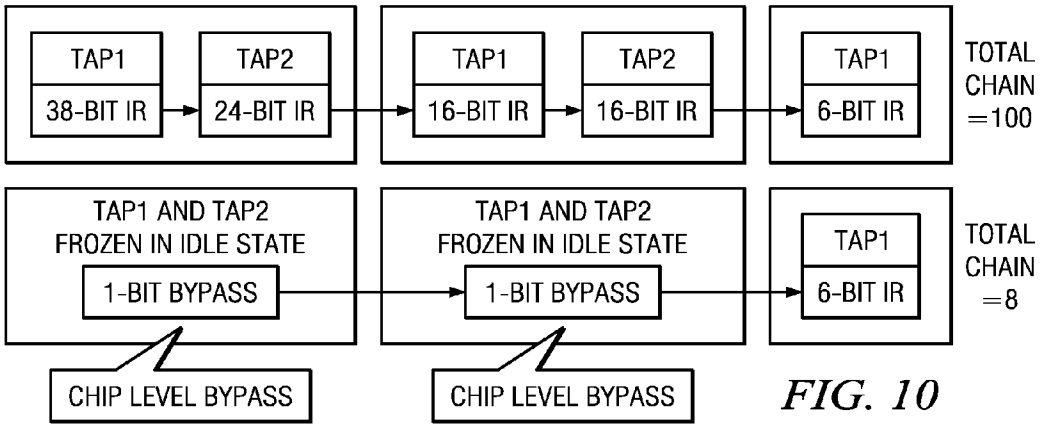
FIG. 10 is a block diagram illustrating bypass bits.

FIG. 10 is a block diagram illustrating bypass bits that are provided to bypass the scan paths managed by the CLTAPC when it is deselected. With a Series Scan Topology, the bypass bit allows faster propagation of scan data between the DTS's TDI(C) and TDO(C) signals when the contents of the bypassed component is not of interest.

Figure 7:
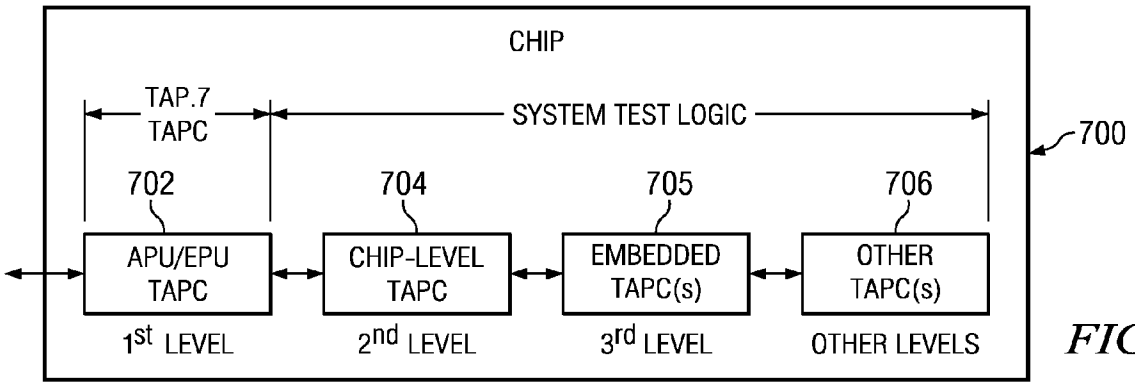
FIG. 7 is a block diagram illustrating TAP.7 TAPC hierarchy.

While all levels of the TAPC hierarchy need not be present in all chips, the TAP.7 architecture accommodates them when they occur. The TAPC hierarchy is shown in FIG. 7. Exemplary chip 700 includes TAPC 702 that is implemented as a T0 with control events or a TSL for T1 and above. Chip level TAPC (CLTAPC) 704 operates under Adapter TAPC (ADTAPC) 700. Embedded TAPC(s) (EMTAPCs) 705 operate under CLTAPC 704. Additional levels of EMTAPCs 706 may be embodied as needed. The EMTAPC(s) 705 and EMTAPC(s) 706 are hidden following a test reset.

A chip with IEEE 1149.7-compliant behavior always has a Chip-Level TAPC 702. It may also include one or more Embedded TAPCs 704, all of which are considered subordinate to the chip-level TAPC (CLTAPC). The CLTAPC is considered the parent of the Embedded TAPC(s). The addition of the Enhanced Protocol Unit (EPU) to a T1 or above TAP.7 controller adds the ADTAPC but does not add instruction or data registers in series or parallel with those associated with the CLTAPC and the EMTAPCs. The ADTAPC is considered the parent of the CLTAPC. The addition of the Advanced Protocol Unit (APU) in a T4 or T5 TAP.7 does not add an additional TAPC or level of TAP.7 TAPC hierarchy.

The ADTAPC 702 is connected to the CLTAPC 704. The CLTAPC may provide access to EMTAPCs. The EMTAPCs are hidden following a Test Reset to present the test view of a component specified by the 1149.1 Standard. The "other TAPCs" portion of the hierarchy can have additional levels of hierarchy. The TAPC hierarchy may vary dramatically by chip, with the TAPs accessed varying by application. In one or more embodiments of the invention, the DTS dynamically manages the TAPC hierarchy to: accommodate a Star Scan Topology, minimize the length of the scan path, and avoid non-functional parts of the hierarchy.

Combined View of TAP Connectivity and TAPC Hierarchy

Figure 8:
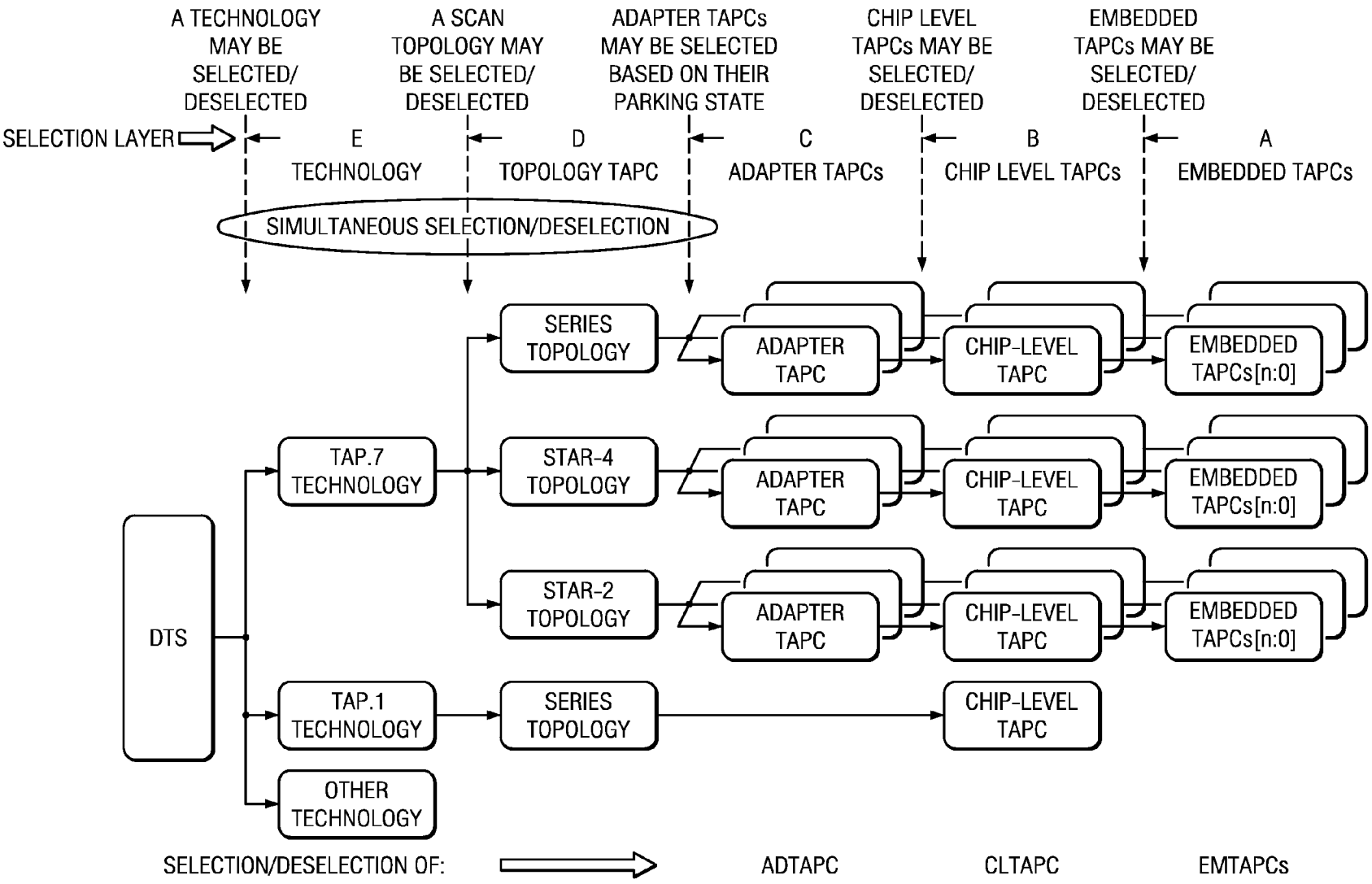
FIG. 8 is an illustrative block diagram of system connectivity supported by TAP.7 architecture.

The combination of the system shown in FIG. 4 and the TAP.7 TAP hierarchy shown in FIG. 7 creates the system connectivity and TAPC hierarchy shown in FIG. 8. The selection layers (labeled A-E) are shown this figure. The entities actually selected and deselected are shown at the bottom of this figure.

Selection Concepts

Additional selection concepts beyond those supported by the IEEE 1149.1 standard are provided to access to the CLTAPCs and EMTAPCs shown in FIG. 8. These concepts support: the use of the selection hierarchy, the parking of CLTAPC and EMTAPC states and resynchronization of the CLTAPC and EMTAPC to the state of their parent, and common signaling across technologies.

Hierarchical Selection and Deselection TAPCs

These concepts provide the DTS the means to interact with all or a subset of the technology connected to it. They provide a means to select the various levels of the hierarchy shown in FIG. 8. Lower levels of the hierarchy become usable when all nodes above it are selected and become unusable when any node above it is deselected. Selection and deselection are provided at the following nodes in the hierarchy: specific technology, Series, Star-4, Star-2, or all TAP.7 Scan Topologies, an ADTAPC within a TAP.7 Scan Topology (depending on the ADTAPC state), a CLTAPC connected to an ADTAPC, and EMTAPCs connected to a CLTAPC.

Determining the Scan Topology

In order for the Debug and Test System to select a particular scan topology, the TAP.7 controller's associated with a scan topology are able to determine this association. The Debug and Test System can inform a TAP.7 controller as to the scan topology in which it resides in simple Scan Topologies. This is not the case with complex scan topologies.

Since T0-T2 TAP.7s can only be used with a Series Scan Topology, these TAP.7 controllers are presumed to be always operating in a Series Scan Topology. Since a T3 and above TAP.7 controller can be operated in either a Series or a Star-4 Scan Topology, T4(W) and T5(W) TAP.7s can be operated in Series, Star-4, and Star-2 Scan Topologies, and T4(N) and T5(N) TAP.7s can be operated in Star-2 Scan Topologies, a TAP.7 controller's association one of these scan topologies is determined at run-time. This is accomplished using a process called Scan Topology Training.

With T3 and above TAP.7s, a TAP.7 controller determines the scan topology in which it resides with Scan Topology Training as follows. The Debug and Test System informs the TAP.7 controllers that Scan Topology Training is underway. It then stimulates the Scan Topology connected to it with TDI(C) and TDO(C) signal values and DR-Scans in a manner that produce differences in the TDI(C) and TDO(C) signal values and scan data observed by TAP.7 controllers in Series, Star-4, and Star-2 Scan Topologies. The TAP.7 controller records the TDI(C) and TDO(C) signal values along with scan data during Scan Topology Training in the Topology (TOPOL) Register. At the conclusion of the training, the TOPOL Register value identifies the scan topology in which the TAP.7 controller resides as the value of the TOPOL Register is are different for TAP.7 controllers deployed in Series, Star-4, and Star-2 Scan Topologies. Each T3 and above TAP.7 includes a TOPOL register, as indicated generally at 920 in FIG. 9.

Topology Register Function

The Topology Register values specify the topology as listed in Table 3.

TABLE 3

Topology Register Values

| TOPOL value | Topology | TDOC behavior |
|---|---|---|
| 00 | Star-4 | TDOC remains HI-Z |
| 01 | Series | TDOC may be driven |
| 10 | Star-4 with TDO drive allowed | TDOC may be driven |
| 11 | Star-2 | TDOC may be driven |

As shown in Table 3, the Topology (TOPOL) Register value affects two operating characteristics: it defines the TAP.7 topology to be specified during selection sequences for the TAP.7 to be placed Online; and it provides a means to HI-Z the TDO signal to prevent drive conflicts that could occur when the scan topology involves both Series and Star-4 Scan technology branches in certain cases (not described herein).

Scan-Path Characteristics Used to Determine the Scan Topology

Figure 9:
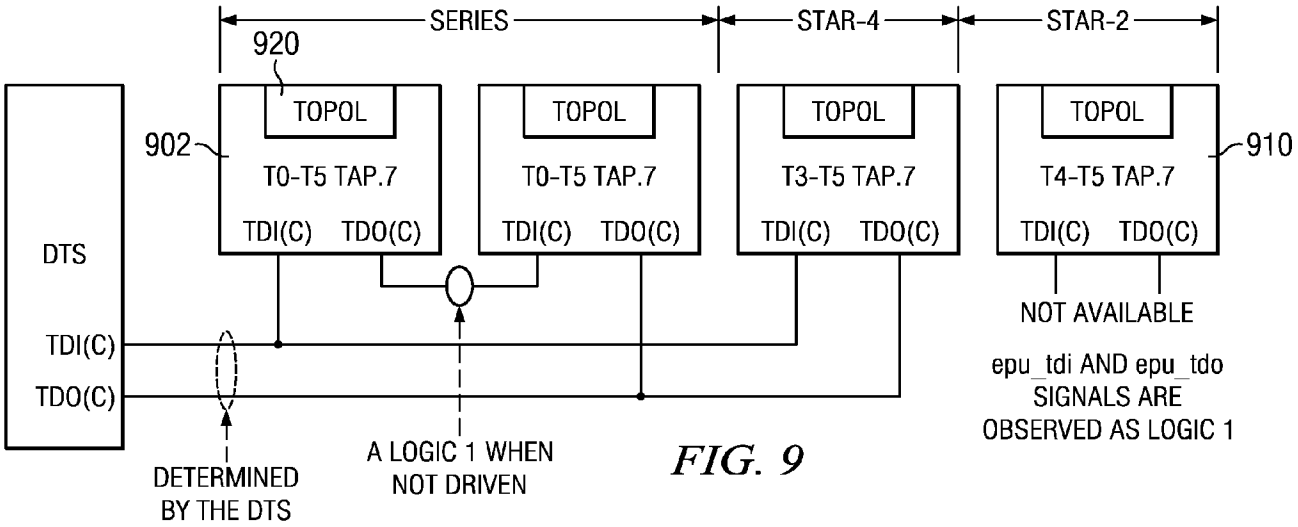
FIG. 9 is a block diagram illustrating system connectivity supported by the TAP.7 architecture.

FIG. 9 is a block diagram illustrating system connectivity supported by the TAP.7 architecture. Exemplary components indicated generally at 902 represent the various components in the target system. Each component includes a scan path that is one or more bits in length. Pins have pull-ups to establish logic value when they not driven. The device 910 does not have TDI(C) and TDO(C) pins. The internal inputs therefore are a logic 1 for these pins. A debug and test system is connected to the TCK(C), TMS(C), TDI(C), and TDO(C) pins. It is capable of driving both the TDI(C) and TDO(C) pins.

Referring again to FIG. 9, the following attributes of Series, Star-4, and Star-2 Scan Paths are used to determine the scan topology in which a TAP.7 controller is deployed. A Series Scan Topology provides scan-path continuity via TDI(C) and TDO(C). Only one of the TDI(C) and TDO(C) signals may be connected to the DTS unless there is only one TAP connected to the DTS. A Star-4 Scan Topology provides scan-path continuity via TDI(C) and TDO(C). Both the TDI(C) and TDO(C) signals are connected to the DTS. In a Star-2 Scan Topology the EPU's TDI signal and TDO inputs are fixed at a logic 1 value when these pins are either not implemented or the TDI(C) and TDO(C) pins are used for alternate functions.

A two step process, scan connectivity and scan continuity testing, that is orchestrated by the DTS exposes characteristics of a TAP.7 controller's connectivity used to determine the Scan Topology. The scan connectivity test records the TDIC and TDOC signal values when both of these signals are driven by the DTS. This test determines whether a TAP.7 controller is deployed in a Star-4 Scan Topology. A logic 0 created by the DTS at the TDIC and TDOC signals can only be observed as such by TAP.7 controllers deployed in a Star-4 Scan Topology. TAP.7 controllers that are deployed in a Series or Star-2 Scan Topology observe either one or both of these signals as a logic 1. When the connectivity test determines the TAP.7 controller is deployed in a Star-4 Scan Topology, this determination survives the connectivity test that follows.

The connectivity test determines whether TAP.7 controllers that are not determined to be deployed in a Star-4 Scan Topology are deployed in a Series or Star-2 Scan Topology. This determination is made based on the scan data values observed during and all zeroes DR-Scan whose length is greater than the longest series scan path. A TAP.7 controller that observes logic 0 scan data is determined to be deployed in a Series Scan Topology while a TAP.7 controller that observes logic 1 scan data is determined to be deployed in a Star-2 Scan Topology. The connectivity and continuity tests are sufficient to determine the scan topology as shown in Table 4.

TABLE 4

Scan topology connectivity and continuity tests results

| | Connectivity test TDIC and TDOC signal value observations | | | Continuity test Scan data value observations along with no Star-4 determination by connectivity test | |
|---|---|---|---|---|---|
| TOPOL | TDIC | TDOC | Scan topology determination | Data observed | Scan topology determination |
| Series | 0b | 1b | No | 0b | Yes |
| Series | 1b | 0b | No | 0b | Yes |
| Series | 1b | 1b | No | 0b | Yes |

TABLE 4-continued

| Scan topology connectivity and continuity tests results | | | | | |
|---|---|---|---|---|---|
| | Connectivity test TDIC and TDOC signal value observations | | | Continuity test Scan data value observations along with no Star-4 determination by connectivity test | |
| TOPOL | TDIC | TDOC | Scan topology determination | Data observed | Scan topology determination |
| Star-4 | 0b | 0b | Yes | 0b | — |
| Star-2 | 1b | 1b | No | 1b | Yes |

Selection/Deselection Capabilities

The TAP.7 controller selection and deselection behaviors are described below:

EMTAPC

Deselection—The scan paths managed by the EMTAPC are not accessible. The TAPC state may or may not continue to advance.

Selection—The scan paths managed by the EMTAPC are accessible. The TAPC state advances.

CLTAPC

Deselection—The scan paths managed by the CLTAPC are not accessible. The CLTAPC state may or may not continue to advance.

Selection—The scan paths managed by the CLTAPC are accessible. The CLTAPC state machine advances.

ADTAPC

Deselection—The ADTAPC scan paths are not accessible. The ADTAPC state does not advance.

Selection—The scan paths managed by the ADTAPC are accessible. The ADTAPC state advances.

The Selection Hierarchy and its Use

Selectable Entities

The term "entity" is used to describe an atomic unit at a connectivity layer affected by a selection/deselection action targeting this layer. The selection and deselection process resumes or suspends the operation one or more entities of a connectivity layer shown in FIG. 8, including: embedded TAPCs, CLTAPCs, and ADTAPCs. Different selection mechanisms are used to select and deselect each of these entity types. These mechanisms are described in more detail below.

EMTAPCs

EMTAPC selection provides a means to deal with chip conditions that may make EMTAPCs inoperable. An example of this is the power-down of chip level logic containing an embedded TAPC. In this case, the scan paths managed by the EMTAPC should be removed from the CLTAPC's scan path before it is powered down and added to the CLTAPC's scan path when powered up. Both of these operations may be under DTS control so that it understands the instruction register and data register scan path configurations at all times. Deselection of TAPCs that are not of interest also improves scan performance.

CLTAPC

CLTAPC selection provides a means of operating TAPCs in Star Scan Topologies. Deselection is essentially a means to bypass the CLTAPC in a Star Scan Topology. Deselection of TAPCs that are not of interest also improves scan performance in all scan topologies.

ADTAPC

ADTAPC selection is provides a means of operating TAPCs with other technologies (1149.1 and/or legacy/proprietary technologies). It is also required to operate T4 and above TAP.7 controllers in a manner where capabilities affecting the advanced protocol are not supported. In this case, a TAP.7 controller deselects itself before it encounters Advanced Protocol sequences it does not comprehend. It may be later selected and resynchronized with the operation of the DTS and other TAPCs.

In multi-chip power conscious systems, the entire chip may be powered up and down during normal operation. In extremely power conscious systems, logic blocks that are not being used are powered down. Since this is part of normal behavior, the ability to debug these types of systems is needed.

The test and debug logic is a logical candidate for power-down as it is generally not used once development and test is completed. The power down of this logic is a subset of the multi-chip power management scenario. In both of these cases, the TAP.7 controller is deselected at start-up (offline at start-up). It may be selected while in this state when criteria preventing its erroneous selection are met. Its selection synchronizes its operation to the DTS and other TAPCs that are already operating.

Selection/Deselection Terminology

TAPC Parent/Child Relationships

The selection hierarchy establishes the parent child relationships between the levels of the selection hierarchy as shown in Table 5.

TABLE 5

| TAPC parent/child relationships | | |
|---|---|---|
| Child | TAP.7 Controller Present? | Parent |
| ADTAPC | N/A | DTS |
| CLTAPC | No | DTS |
| | Yes | ADTAPC |
| EMTAPC | N/A | CLTAPC |

A separate set of terminology is used to describe the relationship of an entity shown in Table 5 and its parent. Even though the functions may be the same, or very close to the same, separate terminology is used so it is clear which parent/child relationship in the selection hierarchy is being described.

EMTAPC Parent/Child Relationships

The Chip-Level TAPC determines which of its children (EMTAPCs) participates in scan operations in which it also participates. It can deny the participation of all of its children or combinations of its children. This is determined by the implementation of the CLTAPC and supporting logic. The participation of an embedded TAPC in these scan operations is defined as one of the following scan selection states: 1) Normal, in which the TAPC state machine runs in lock-step with the CLTAPC state machine, its IR-Scan path is part of the scan path as viewed from the CLTAP during the Instruction Register scans, and its DR-Scan path is part of the scan path during Data Register scans; 2) Excluded, in which the TAPC state machine of an excluded TAPC runs in lock-step with the other TAPCs, its IR-Scan path is part of the scan path as viewed from the CLTAP during the Instruction Register scans, and its DR-Scan path is not part of the scan path during Data Register scans; and 3) Isolated, in which the state of an isolated TAPC does not run in lock-step with the other TAPCs and is parked in either the Test-Logic-Reset or Run-Test/Idle state, its IR-Scan path is not part of the scan path as viewed from the CLTAP during the Instruction Register scans, and its DR-Scan path is not part of the scan path during Data Register scans. An ETAPC is considered selected when the selection state is Normal and deselected otherwise.

The DTS initiates Normal operation of an embedded TAPC when it desires access to the TAPC's IR and DR scan-paths. When the EMTAPCs are connected so as to operate in series, the DTS initiates Excluded operation of the embedded TAPC when it does not desire access to the TAPC's DR scan-paths. When the EMTAPCs are connected so as to operate in parallel, or both the IR and DR scan paths are removed from the scan path when the EMTAPC is selected, the DTS initiates Isolated operation of an EMTAPC when it has no desire to access the TAPC's IR and DR scan-paths. This scheme can also be deployed by the EMTAPCs to determine which of its children participate in scans operations in which the Chip-Level TAP participates. The operation of a child of the CLTAPC or a child of a child of the CLTAPC is referred to as Normal, Excluded, or Isolated.

CLTAPC Parent/Child Relationships

The TAP.7 TAPC determines whether the CLTAPC participates in scan operations in which it also participates. The participation of the CLTAPC in these scan operations is defined as one of the following scan selection states: 1) Coupled, in which the CLTAPC state machine runs in lock-step with the TAP.7 TAPC state machine, the IR-Scan path presented by the CLTAPC is the scan path presented by the TAP.7 during the Instruction Register scans, and its DR-Scan path presented by the CLTAPC is the scan path presented by the TAP.7 during Data Register scans; 2) Ignored, in which the TAPC state machine of an ignored CLTAPC runs in lock-step with the with the TAP.7 controller TAPC state machine, its IR-Scan path is part of the scan path as viewed from the Chip TAP pins during the Instruction Register scans, and its DR-Scan path is not part of the scan path during Data Register scans; and 3) Decoupled, in which the TAPC state machine of a decoupled CLTAPC does not run in lock-step with the TAP.7 controller TAPC state machine and is parked in either the Test-Logic-Reset or Run-Test/Idle TAPC state, the CLTAPC IR-Scan path is not part of the scan path as viewed from the Chip TAP pins during the Instruction Register scans, and its DR-Scan path is not part of the scan path during Data Register scans. The TAP.7 provides a one-bit scan path for both IR and DR Scans. The CLTAPC is considered selected when the selection state is Coupled and deselected otherwise.

The DTS initiates coupled operation the CLTAPC when it desires access to the TAPC's IR and DR scan-paths. With series selection approaches, the DTS initiates Ignored operation of the CLTAPC when it desires to substitute a one bit TAP.7 Controller supplied scan path for the TAPC's DR scan-paths. The DTS initiates decoupled operation of the CLTAPC when it has no desire to access the TAPC's IR and DR scan-paths. The operation of the CLTAPC is referred to as Coupled, Ignored, or Decoupled. Any references to the CLTAPC or the System Test Logic (STL) being coupled, decoupled, or ignored are equivalent.

TAP.7 TAPC Parent/Child Relationships

The DTS determines when its children (ADTAPCs) participate in any operation. Its children may include a TAPC in any of the branches of the DTS/TS connectivity shown in FIG. 8. It can deny the participation of all of its children or combinations of its children. This is determined by the method used to select a child (selection by separate or shared connectivity). T4 and T5 TAP.7 ADTAPCs deselect themselves before they loose synchronization with the DTS when directed to perform an operation that would cause them to lose synchronization with the DTS and other TAPCs.

The participation of a technology entity (TAP.7, TAP.1, or other technology) in DTS operations is defined as one of the following scan selection states: 1) Online, in which the entity operates in lock-step with the other TAPCs and the DTS; and 2) Offline, in which the entity operation is suspended with its scan and transport functions frozen in place. The TAPC controller is considered selected when the selection state is Online and deselected otherwise. The term "online" is used to describe a technology that is selected. The term "offline" is used to describe a technology that is deselected.

Parent/Child Relationship Summary

Table 6 provides a summary of the terminology used to describe entity operation.

TABLE 6

Selection state terminology summary

| Entity | Synchronized/ Provides all services | Synchronized/ Provides no services | Not Synchronized/ Provides no services |
|---|---|---|---|
| Embedded TAPC | Normal | Excluded | Isolated |
| CLTAPC | Coupled | Ignored | Decoupled |
| TAP.7 TAPC. | Online | N/A | Offline |
| TAP.1 branch, Other technology | | | |

TAPC State Machine Parking States and Resynchronization

The TAPC state machine state that exists when its advance is suspended is called its "parking state". The value of this state is important as it defines the only TAPC state machine state where the TAPC may be resynchronized to the TAPC state of the DTS and other TAPCs. A TAPC whose state machine state is parked may be synchronized with the DTS TAPC state machine only when the DTS and ADTAPC states are the same or can be made the same by a stay in a state that is stable (Test-Logic-Reset, Run-Test/Idle, Pause-IR, and Pause-DR).

The selection and deselection states for the TAPCs in the selection hierarchy are shown in Table 7.

TABLE 7

Selection and Deselection states

| Entity | Deselection | Reset while deselected | Selection |
|---|---|---|---|
| Embedded TAPC | Run-Test/Idle, Pause-DR, Pause-IR, Select-DR, Run-Test/Idle | Test-Logic-Reset | Run-Test/Idle, Pause-DR, Pause-IR, Select-DR, Run-Test/Idle, Test-Logic-Reset |
| CLTAPC | | Test-Logic-Reset | |
| TAP.7 TAPC | Any state | Test-Logic-Reset | Pause-DR, Pause-IR, Select-DR, Run-Test/Idle, Test-Logic-Reset |

Selection and De-Selection Mechanisms

The selection mechanisms that are used for the selection of TAPCs at layers C, B, and A of the selection hierarchy are listed below. Note that they are different for each level of the selection hierarchy. For Embedded TAPCs, register information provided by prior CLTAPC scans is applied with the Run-Test/Idle state. For CLTAPCs, there are two mechanisms depending on the TAP.7 class: 1) T2-T5—register information is applied with the Run-Test/Idle state; 2) T3-T5—Scan Selection Directives (SSDs). For TAP.7 TAPC, the mechanism is special signaling (control events) plus subsequent information for selection (TAP.7 technology, Scan Topology, TAPC state machine state).

Special TAP.7 Controller Considerations

With normal operation of the TAP.7 controllers sharing a DTS connection, the TAPC state of one or more TAP.7 controllers may be parked in any state. Parking states may differ across the TAP.7 controllers whose states have been parked. Since the parking states of TAP.7 controller A and B may be different, the DTS supplies the following to place a TAP.7 controller online: 1) the technology being selected—TAP.7, 2) the scan topology required for selection—Series, Star-4, Star-2, or any of these (not used to determine selection); and 3) the TAPC state which is required to synchronize the operation of the TAP.7 controller with the DTS and other operating TAPCs—Test-Logic Reset/Run-Test/Idle, Select-DR, Pause-DR, Pause-IR.

The selection mechanism is capable of placing an ADTAP.7 online only when its parking state is one of the TAPC states listed above. With other parking states, the TAP.7 controller will remain offline until a TAP.7 controller reset creates the Test-Logic Reset state Common Signaling Across Technologies A command sequence is provided to establish the scan topology in which an ADTAPC is deployed since the TAP.7 controller needs to know the scan topology in which it is deployed. Selection/deselection interoperability with proprietary, legacy, and TAP.7 technologies requires the use of a common set of signaling conventions for these functions. These signaling conventions cannot already be utilized by any of these technologies. The DTS and TS exchange information in one of two ways: 1) A TCK(C) signal edge sampling the TMS(C) signal value; and 2) a count of TMS(C) signal edges while the TCK(C) signal is a logic 1. Both of these means may be used concurrently within the same TCK(C) bit period. The following signaling characteristics make this possible.

With both the Standard and the Advanced Protocols, the TMS(C) signal value changes no more than once per TCK (C) period, provided information is conveyed only with the TCK(C) signal sampling the TMS(C) signal value. The TAP.7 architecture uses this fact to convey the second form of information during a TCK(C) bit period utilizing a special TCK(C)/TMS(C) signaling sequence called an Escape Sequence. With an Escape Sequence, the DTS toggles the TMS(C) signal an even number of times while the TCK(C) signal is a logic 1 to convey both forms of information. In some embodiments, the number of TMS(C) edges created by the DTS must be even to restore the original value of TMS(C) established at the beginning of the bit period by the falling edge of TCK(C).

In some embodiments, there are four types of escape sequences. The DTS generates an escape sequence by edges creating an even number of TMS(C) edges while TCK(C) is a logic 1. The number of TMS(C) edges for each escape sequence is shown in parenthesis in Table 8. This edge count is in addition a TMS(C) edge that may occur as a result of the TMS(C) edge establishing the TMS(C) value for the bit period, when this edge occurs after TCK(C) is a logic 1 due to analog delays:

TABLE 8

Control Events signaled via TMS(C) and TCK(C)

| No escape sequence (0) | Description |
|---|---|
| Custom (2 or 3 edges) | Performs a technology specific function. |
| Deselection (4 or 5 edges) | Initiates the deselection of an online technology. |
| Selection (6 or 7 edges) | Initiates the selection of a technology via a subsequent selection test. |
| Reset (>7 edges) | Resets all technologies (generates a Type-3 TAP.7 TAPC reset) inhibit TMSC drive after the detection of eight edges |

The TAP.7 controller logic accommodates the possibility that the TMS(C) edge establishing the TMS(C) value for the bit period may occur after the TCKC signal is a logic 1. This can occur as a result of analog delays in the system. When this occurs, the TAP.7 controller interprets an odd number of edges occurring while TCK(C) is a logic one as the next lowest even number. This makes the TAP.7 controller's escape sequence detection logic insensitive to the timing relationship of the TCK(C) falling edge and a change in the TMS(C) value generated by the TCK(C) falling edge.

Figure 11A:
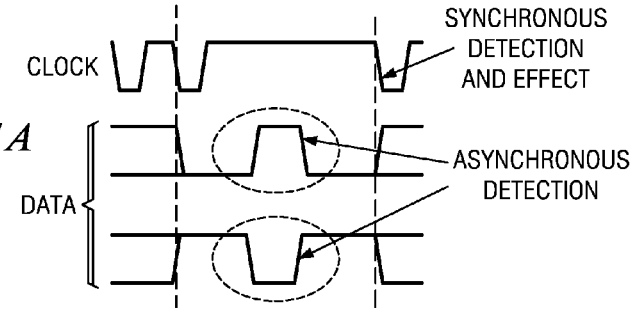
FIGS. 11A-11D illustrate signaling of commands using the TCK(C) and TMS(C) signal lines.
Figure 11B:
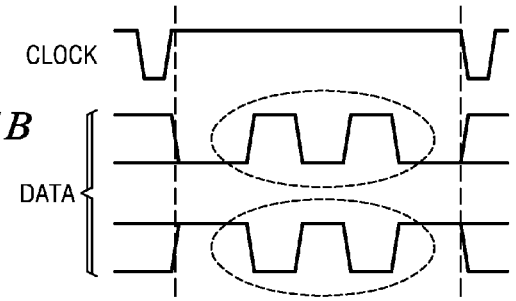
Figure 11C:
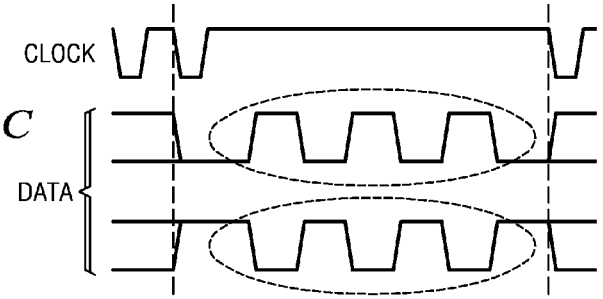
Figure 11D:
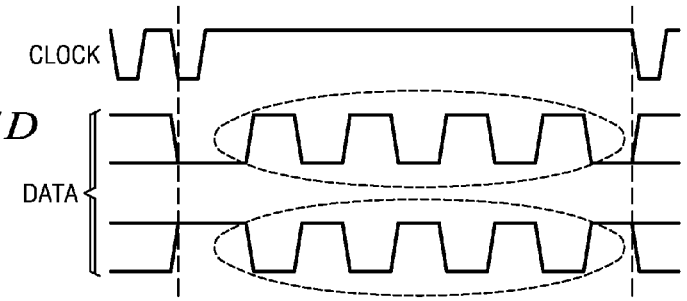

A signaling convention for escapes is multiple data transitions of the TMS(C) signal while the TCK(C) signal is a logic 1, as illustrated in FIGS. 11A-11D. The Deselection and Selection Escapes are used for technology selection purposes. The common signaling space described above is available when the DTS sources the TCK(C) signal as it is capable of creating these signaling conventions. FIG. 11A illustrates two edge transitions on TMS(C) that indicates a command that may be used for custom use of online technology. FIG. 11B illustrates four transitions on TMS(C) that indicates a de-selection command of all technologies. FIG. 11C illustrates six or seven edge transitions on TMS(C) that indicates a selection sequence follows. A selection sequence determines whether a technology is selected. FIG. 11D illustrates eight or more edge transitions on TMS(C) that indicates a reset action for all technologies.

Deployment

Figure 12:
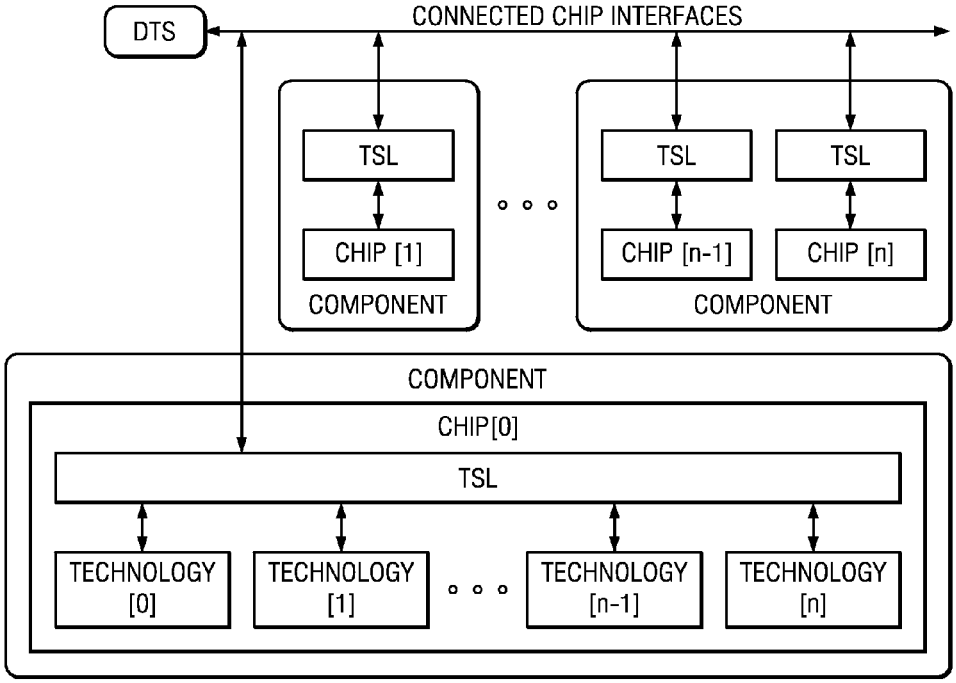
FIG. 12 is a block diagram illustrating placement of TSL in various components of a chip or system.

The Technology Selection Logic (TSL) uses the common signaling concept outlined above. It may be added to new chip interface (IF) or existing/hardened component design as a wrapper. The TSL Is placed between this IP and the pins that are normally connected to a DTS and allows the sharing of chip clock and test pins by multiple technologies on the same chip, as illustrated in FIG. 4 and in FIG. 12. The TSL function in each component provides for the shared connectivity of these pins with chips deployed with one or more technologies. The TSL function receives and decodes TCK and TMS(C) signaling indicating escapes.

After the power-up of the target system none, one, or more than one of the technologies sharing a DTS connection is selected. The selected technology should not drive the pins until properly stimulated by externally sourced signaling. The DTS may select the technology of interest thereafter once it is connected to the system using the TSL.

The use of technologies sharing the DTS connection is generally different for test and debug. Debug is likely to use technologies one at a time, use a technology for a period of time, perform multiple instruction register (IR) and data register (DR) scans or other operations while using a technology, and select and deselect scan based technologies in either the Run-Test/Idle or the Select-DR-Scan state.

Figure 13:
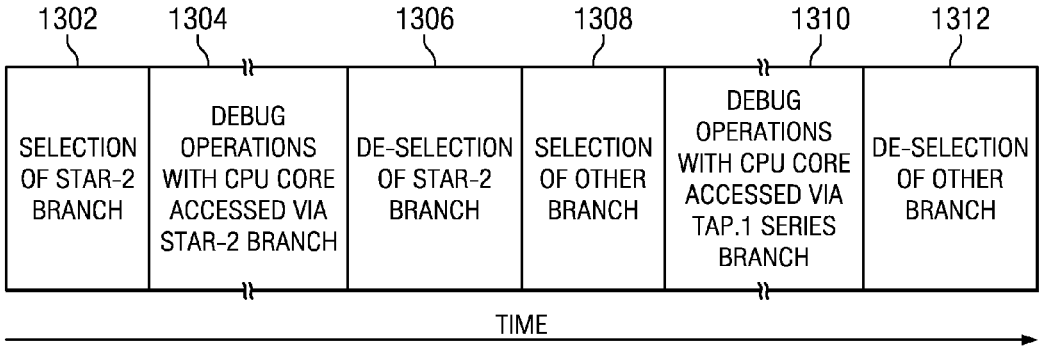
FIG. 13 is a time line illustrating an example of debug use of the TSL.

An example of debug use of the Star-2 and the TAP.1 Series branches of exemplary system connectivity is shown in FIG. 13. In this example, the state of a CPU core is accessed through an embedded TAPC in the Star-2 branch of the component followed by the same operation with a different TAPC in the Series branch. The example begins with the two branches deselected with their TAPC state machine state parked in the Run-Test/Idle state. Subsequently, the branches are sequentially used with the following steps: select the Star-2 branch by specifying these selection criteria: TAP.7 TAPC technology; Star-2; Run-Test/Idle 1302; operating with the selected branch, advance TAPC state machine state to Run-Test/Idle 1304; deselect the Star-2 branch 1306; select the TAP.1 series branch by enabling its TCK 1308; operate with the selected branch 1310; and deselect the branch 1312. This sequence may be repeated by again selecting 1302 the Star-2 branch by specifying these selection criteria: TAP.7 TAPC technology; Star-2; Run-Test/Idle, etc.

Figure 14:
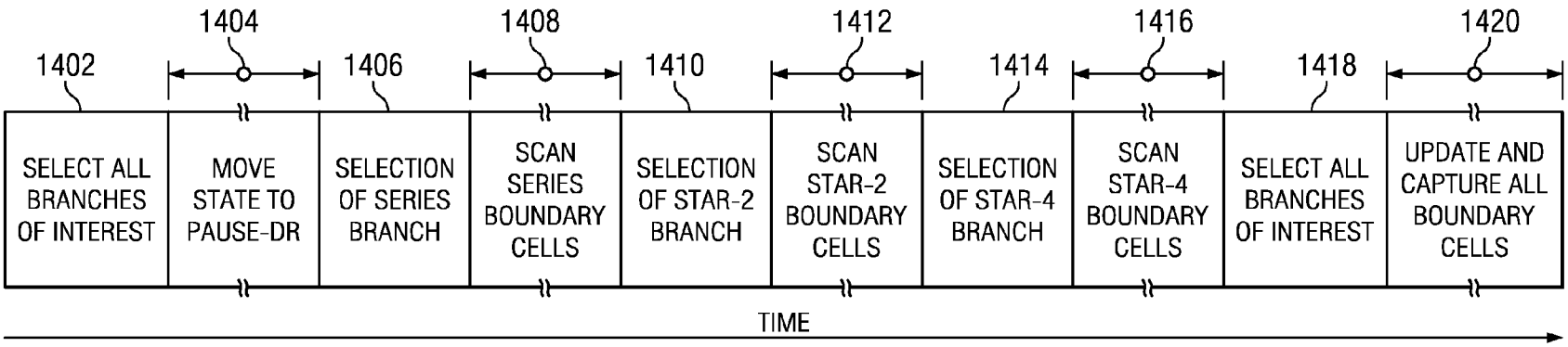
FIG. 14 is a time line illustrating use of series, Star-4 and Star-2 scan technologies concurrently.

Test is likely to use technology selection to create series equivalent scans spanning multiple or all technologies sharing the DTS connection as shown in FIG. 14. When creating this type of series, equivalent scan selections primarily occur while in the Pause-DR and Pause-IR states. Shift operations are performed while only one branch of the system connectivity is enabled. Capture and Update operations are performed with all scan technologies of interest (Series, Star-4, and Star-2) selected.

In the example shown in FIG. 14, a series equivalent scan is created with Series, Star-4, and Star-2 branches sharing the DTS connection. The boundary scan cells of each branch are scanned sequentially as shown. Once this is complete, all of the branches are simultaneously selected (this is supported in the selection criteria). The ADTAPC state is moved from Pause-DR through the Update-DR and Capture-DR followed by Pause-DR without an intervening Shift-DR state simultaneously in all ADTAPCs. This is the same process used for creating a Series Equivalent Scans for Star-4 and Star-2 Scan Topologies.

Once a branch is selected, the methods used to create series equivalent scans within the technology may be used. Many operations can be created spanning multiple technologies. Any technology of interest may be selected or deselected in any of the parking states.

A more detailed description of the activity shown in FIG. 14 is now described. This example begins with each of the technologies deselected with their TAPC state machine state parked in the Run-Test/Idle state. Subsequently, a series equivalent scan is created with the following steps: 1) select the branches of interest with this criteria: TAP.7 TAPC technology, All, Run-Test/Idle 1402; 2) move the TAPC state as follows: Run-Test/Idle, Select-DR, Capture-DR, Exit1-DR, and Pause-DR, after which all branches of interest in are in the Pause-DR state 1404; 3) select the Series Branch 1406; 4) scan, without capture or update operations, the boundary cells in the Series Branch ending with the TAPC state machine state in Pause-DR without moving through Update-DR 1408; 5) select the Star-2 Branch by specifying its selection criteria: TAP.7 TAPC technology, Star-2, Pause-DR 1410; 6) use SSDs to scan, without capture or update operations, the boundary cells of all CLTAPCs connected to TAP.7 TAPCs in the Star-2 Branch 1412 and advance TAPC state machine state to Pause-DR; 7) select the Star-4 branch by specifying these selection criteria: TAP.7 TAPC technology, Star-4, Pause-DR 1414; 8) use SSDs to scan, without capture or update operations, the boundary cells of all CLTAPCs connected to TAP.7 TAPCs in the Star-4 Scan Topology 1416 and advance TAPC state machine state to Pause-DR without moving through Update-DR; 9) select all branches by specifying these selection criteria: TAP.7 TAPC technology, All topologies, Run-Test/Idle 1418; and move TAPC state machine state through Update-DR>Select-DR-Scan>Capture-DR>Exit1-DR>Pause-DR 1420 to update and capture all boundary cells. Repeat this sequence beginning with selection of the Series branch 1406 for additional scans.

Using SSDs to Create Scan Equivalency

Figure 15A:
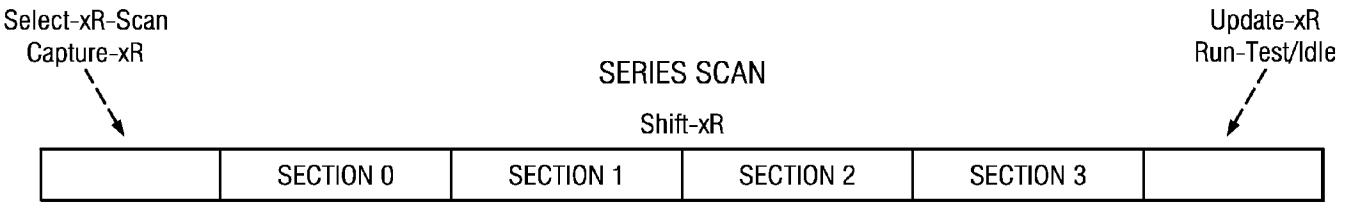
FIG. 15A illustrates a series scan.

A typical series scan at the chip level is illustrated in FIG. 15A. In this example, four TAP controllers are connected in series. The scan path connecting all four is shifted to set up a test, and the test is run. Afterwards, the results may be shifted out of all four in series.

Figure 15B:
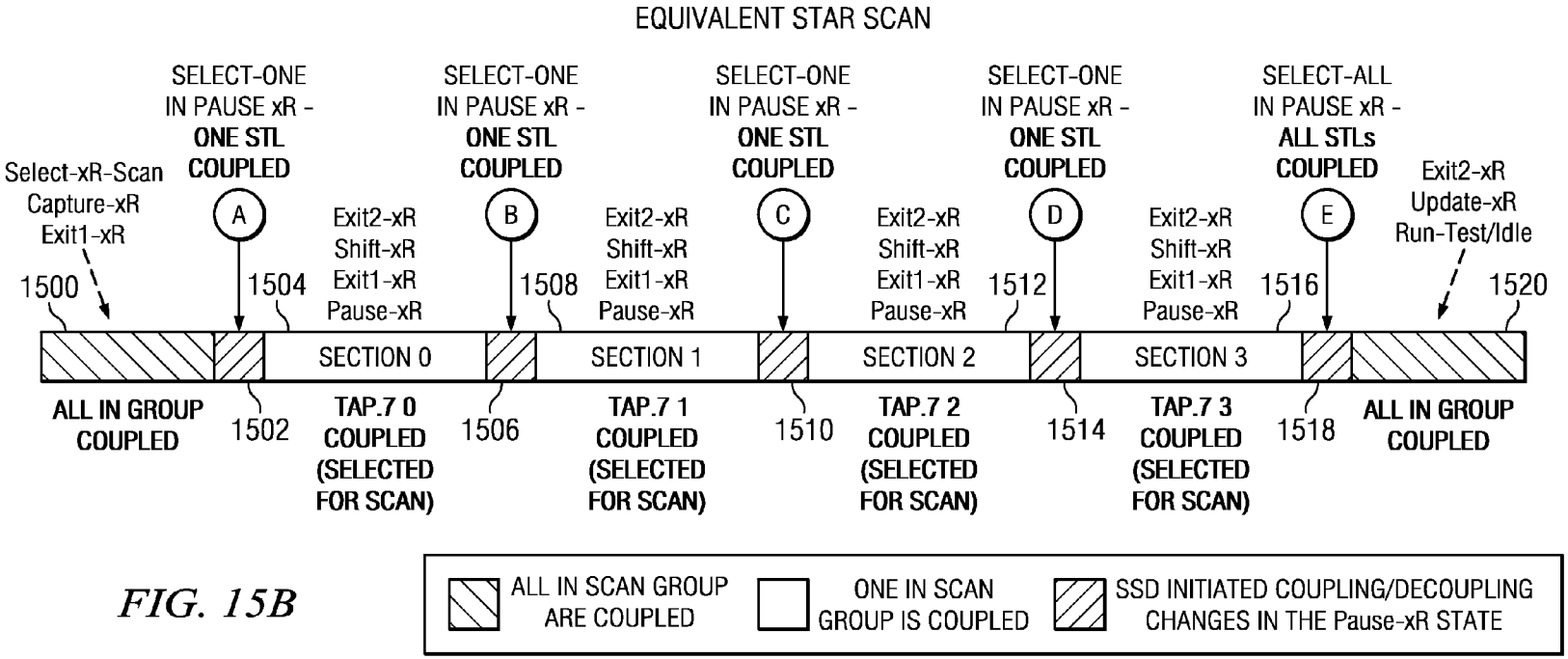
FIG. 15B illustrates a series equivalent scan in a star connected topology at the chip level.

An example of a scan in a Star Scan Topology providing the equivalent function of a scan in a series scan topology at the ship level is shown in FIG. 15B. This example has four T3 TAP.7s connected in a Star-4 Scan Topology, similar to that illustrated in FIG. 2. It illustrates the scan activity at level B of the scan hierarchy. In this case, since the TDO signals of each TAP.7 controller are connected in parallel, only one controller at a time can be in a shift state. A test begins with the use of scan selection directives (SSDs) to select the CLTAPCs that manage their scan paths, with these scan paths becoming the four shift sections of the scan. All TAP.7 controllers (0-3) are selected as indicated at 1500.

When the Star Topology is part of a complex topology, the sections beginning from point 1502 to point 1518 become a section of the scan of a branch shown in FIG. 15B, for example 1502 to 1506, 1506 to 1510, 1510 to 1514, or 1514 to 1518. In this case activity shown prior to point 1502 and after point 1508 is replaced with activity prior to point 1502 and after 1518. This is determined by the TAPC hierarchy.

The CLTAPC state of all four CLTAPCs is moved to point A 1502 through the Capture-xR state to the Pause_xR state without an intervening Shift-xR state. Once the Pause-xR state is reached, a Select-One SSD selects the CLTAPC of a single TAP.7 while deselecting the CLTAPC of other TAP.7 controllers at points A 1504, B 1506, C 1510, and D 1514. The CLTAPC of a different TAP.7 is selected at each of these points. Within logic module sections 0-3, scan data is exchanged with the coupled CLTAPC. When the exchange of scan data with a coupled CLTAPC is completed, its state is returned to Pause-xR, as indicated at 1504, 1508, 1512, and 1516. When point 1518 is reached, all CLTAPCs are coupled with a Select-All SSD. The scan is then completed by moving the CLTAPC state through the Update-DR TAPC state 1520. This process is used for both IR and DR Scans.

The TAPC state progression may be limited to Exit2-xR, Shift-xR, Exit1-xR, and Pause-xR states during the scan data exchange so as to not cause an Update-xR TAPC state. Since only one CLTAPC reaches the Shift-DR state at any one point in time, there is no drive conflict at the TDOC pin and data is exchanged with the coupled TSL.

The steps for performing a typical series equivalent scan are as follows: 1) select all branches; 2) select all CLTAPCs in all branches, specify the use of the Standard Protocol; 3) move to the Pause-xR state without encountering the Shift-xR state; 4) with TAPC state of Pause-xR, select a single branch and specify the use of a protocol compatible with the selected branch; 5) with TAPC state of Pause-xR, select one CLTAPC within the branch; 6) with TAPC state of Pause-xR, perform the scan without encountering an Update-xR state; 7) repeat two above steps until all system paths of interest within this branch are scanned; 8) repeat three above steps until all system paths of interest are scanned for all branches; 9) with TAPC state of Pause-xR, select all branches; 10) with TAPC state of Pause-xR, select all CLTAPCs and specify the use of the Standard Protocol; 11)

move through Update-xR and Capture-xR without encountering an Shift-xR state, ending in the Pause-xR state; and 12) go to step 4.

Once a single branch is selected, a function called a "Scan Selection Directive" or "SSD" is used to select one and only one CLTAPC to provide the system path of interest. For example, the SSD may be a command that uses an identification number associated with each CTAPC, for example. In another embodiment, it may be a command that uses multiple edges, as described above. In other embodiments, the SSD may use a selection mechanism unique to the particular CLTAPCs, etc. At this point, only one CLTAPC is selected. After the CLTAPC's selection, the CLTAPC state is moved from the Pause-xR state to the Shift-xR state to the Pause-xR state without traversing the Update-xR state while the states of other CLTAPCs remain parked in the Pause-xR state. Once the scan of the scan path of interest is completed, a different CLTAPC is selected, with the scan of the scan path of interest subsequently completed. When the scan of all scan paths of interest is completed the next sequential branch is selected and the process outlined in this paragraph repeated.

When the scan of the scan paths of interest in all branches is completed, all branches are selected. At this point the TAPC state of all TAPCs is Pause-xR. At this point, the TAPC state is moved from Pause-xR to Pause-xR, traversing the Update-xR and Capture-xR states.

With series equivalent scans, Scan Selection Directives (SSDs) are used to select and deselect CLTAPCs within a selected Star branch. The "select one" SSD uses a unique value identifying the TAP.7 controller to select the targeted TAP controller. That value can be a TAP Controller Address (TCA) or a Controller Identifier (CID). A TCA may be a 35-bit value comprising a 27-bit IDCODE concatenated with an 8-bit node identification number (NODE ID). Per the IEEE 1149.1 specification, the 32-bit IDCODE comprises logic 0, a 16-bit part number and an 11-bit manufacturer identifier, and 4-bit revision code. With the TAP.7 architecture, the 16-bit part number and the 11-bit manufacturer identifier are concatenated with an 8-bit NODE ID to create a 35-bit TAPC address. The 8-bit NODE ID provides for 256 uniquely addressable TAP controllers with identical a 16-bit part number and the 11-bit manufacturer identifier elements. The NODE_ID is created at the chip level using any one of several methods or a mix of the following methods: from external pins whose value is latched when chip hard reset is released, fusible elements, programmable elements such as electrically-erasable programmable read-only memories (EEPROMs), a register loaded by the application, and fixed (hardwired). The TCA is generated and provided to the associated TAP controller.

Since TCAs are 35 bits in length and at least some systems will have 16 or fewer TAP controllers, the DTS may choose to allocate a four-bit alias for up to 16 TCAs to create a performance improvement for boundary scan operations and allow the use of efficient commands for other test and debug functions. This alias is called a Controller ID (CID). Any of a variety of techniques is possible to allocate CIDs to each TAP controller.

The SSDs described above can use either the TCA or CID values to select a particular TAP controller. SSDs are encoded with a 3-bit directive to specify the type of SSD. A directive bit pattern of "010" means that the SSD is a "select one" SSD using a CID. The CID value is part of the SSD's payload. A directive bit pattern of "110" means that the SSD is a "select one" SSD using a TCA, which is part of the SSD's payload. A directive bit pattern of "111" means that the SSD is the "select all" SSD. A directive bit pattern of "000" means that the SSD is a "clear all" SSD (all members of the Scan Group are decoupled).

Figure 16:
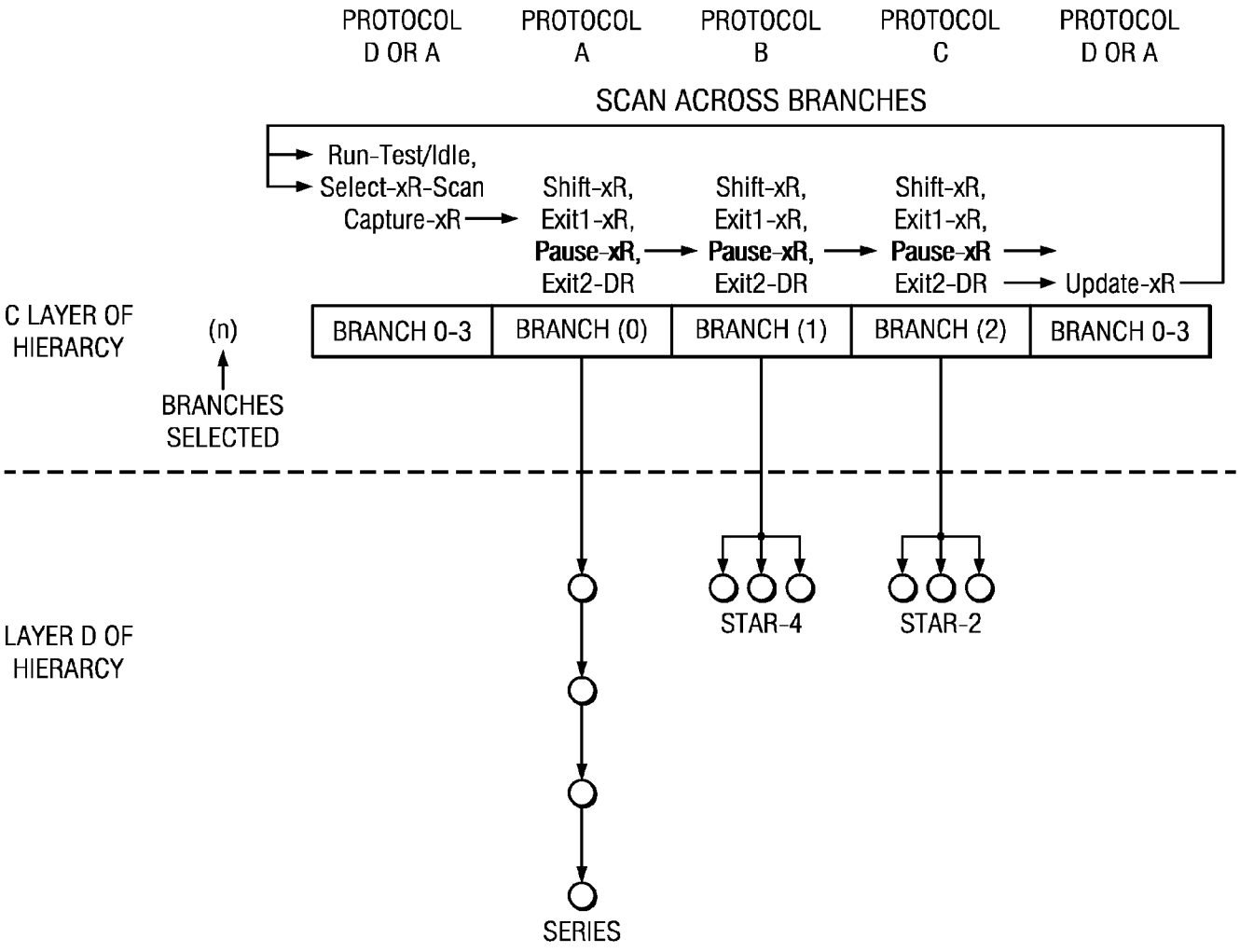
FIG. 16 illustrates a series equivalent scan across branches in a topology.

FIG. 16 illustrates a series equivalent scan across branches in a complex scan topology. The steps for performing this series equivalent scan are as follows: 1) select all branches and specify the use of the Standard Protocol; 2) move to the Pause-xR state without encountering the Shift-xR state; 4) with TAPC state of Pause-xR, select a single branch and specify the use of a protocol compatible with the selected branch; 5) with TAPC state of Pause-xR, select one CLTAPC within the branch; 6) with TAPC state of Pause-xR, perform the scan without encountering an Update-xR state ending with the Pause-xR state, 7) repeat steps 5 and 6 until all system paths of interest within this branch are scanned; 8) repeat steps 4-7 above steps until all system paths of interest are scanned for all branches; 9) with TAPC state of Pause-xR, select all branches specify the use of the Standard Protocol; 10) with TAPC state of Pause-xR, select all CLTAPCs that are parked in Pause-xR state o, 11) move through Update-xR and Capture-xR without encountering an Shift-xR state, ending in the Pause-xR state; and 12) go to step 4.

Figure 17:
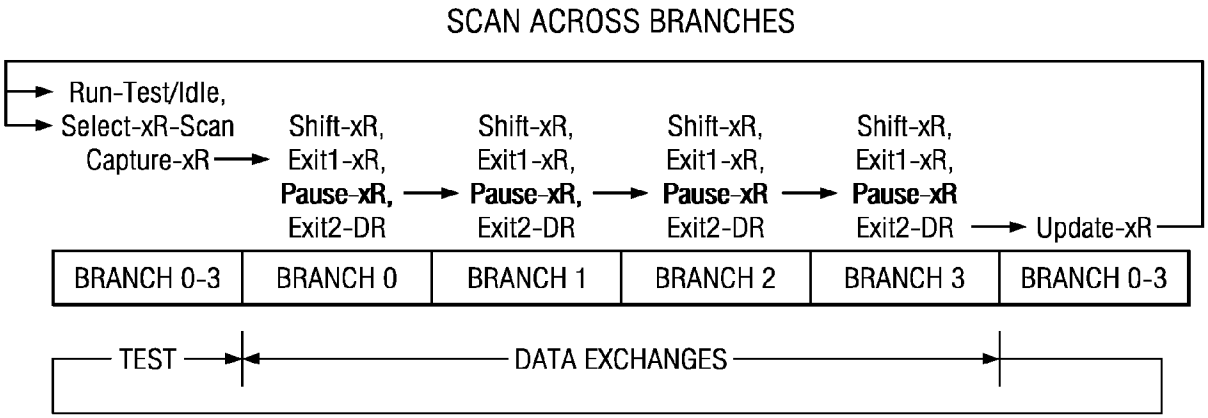
FIG. 17 is another illustration of a series equivalent scan.

FIG. 17 is another illustration of a series equivalent scan illustrating that data exchanges are done using the scan state when only one TAPC is selected, but testing may proceed in parallel across all of the branches using the system test logic in each branch component after it is initialized during the scan phase. Test results are captured in parallel. The test results are then scanned out by selecting each TAPC individually.

Other Embodiments

While the invention has been described with reference to illustrative embodiments, this description is not intended to be construed in a limiting sense. Various other embodiments of the invention will be apparent to persons skilled in the art upon reference to this description.

Although the embodiments of the invention find particular application to systems using Digital Signal Processors (DSPs), implemented, for example, in an Application Specific Integrated Circuit (ASIC), other embodiment may find application to other types of systems, which may have another type of processors. Another embodiment may also be a system that does not include a processor. An ASIC that embodies the invention may contain one or more megacells which each include custom designed functional circuits combined with pre-designed functional circuits provided by a design library, wherein some or all of the megacells include a test access port.

An embodiment of the invention may be a substrate to which is attached multiple chips that have individual test access ports, commonly referred to multi-chip modules. An embodiment may include stacked die devices that have individual test access ports. Another embodiment may be a substrate, such as a printed circuit board, to which is attached multiple chips that have individual test access ports.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

[1. A method for performing series equivalent scans in a target system comprising a complex scan topology with a plurality of branches, the method comprising:

performing shift operations in the complex scan topology while scan path connectivity of only one branch of the complex scan topology is enabled, wherein a first branch and a second branch are different test access port technologies, and wherein a first protocol is used to perform shift operations on the first branch and a different second protocol is used to perform shift operations on the second branch; and performing capture and update operations in the first branch and the second branch of the complex scan topology in parallel.]

[2. The method of claim 1, wherein test access ports of at least two of the branches are connected in parallel.]

[3. The method of claim 1, wherein while the first branch is selected to perform a shift operation, the second branch is deselected and remains dormant.]

[4. The method of claim 3, wherein a deselected branch ignores protocol signaling except for the detection of reset events, and selection events and the selection sequence that follows selection events.]

[5. The method of claim 4, wherein a deselected branch responds to a selection escape and the selection sequence that follows it to be selected.]

[6. The method of claim 3, wherein selection and deselection provides for the selection of a specific technology, or group of technologies of a complex scan topology by selecting a series, a Star-4, a Star-2, and all of the Series, Star-4 and Star-2 topologies.]

7. [The method of claim 3,] *A method for performing series equivalent scans in a target system comprising a complex scan topology with a plurality of branches, the method comprising:*

*performing shift operations in the complex scan topology while scan path connectivity of only one branch of the complex scan topology is enabled, wherein a first branch and a second branch are different test access port technologies, and wherein a first protocol is used to perform shift operations on the first branch and a different second protocol is used to perform shift operations on the second branch;*

*performing capture and update operations in the first branch; and*

[wherein] selecting a hierarchy level below a debug test system (DTS) coupled to the target system [comprises] *comprising* selection of an Adapter Test Access Port Controller (ADTAPC) from among a plurality of ADTAPCs within a complex scan topology.

8. [The method of claim 3,] *A method for performing series equivalent scans in a target system comprising a complex scan topology with a plurality of branches, the method comprising:*

*performing shift operations in the complex scan topology while scan path connectivity of only one branch of the complex scan topology is enabled, wherein a first branch and a second branch are different test access port technologies, and wherein a first protocol is used to perform shift operations on the first branch and a different second protocol is used to perform shift operations on the second branch;*

*performing capture and update operations in the first branch; and*

[wherein selection of the] *selecting a* hierarchy level below the ADTAPC [comprises] *comprising* selecting a Chip Level Test Access Port Controller (CLTAPC) from among a plurality of CLTAPCs, each connected to an Adapter Test Access Port Controller (ADTAPC).

9. [The method of claim 3,] *A method for performing series equivalent scans in a target system comprising a complex scan topology with a plurality of branches, the method comprising:*

*performing shift operations in the complex scan topology while scan path connectivity of only one branch of the complex scan topology is enabled, wherein a first branch and a second branch are different test access port technologies, and wherein a first protocol is used to perform shift operations on the first branch and a different second protocol is used to perform shift operations on the second branch;*

*performing capture and update operations in the first branch; and*

[wherein selection of the] *selecting a* hierarchy level below the CLTAPC [comprises] *comprising* selecting an Embedded Level Test Access Port Controller (EMTAPC) connected to a Chip Level Test Access Port Controller (CLTAPC).

[10. The method of claim 1, wherein performing capture and update operations in parallel comprises receiving a select-all command by the first and second branches, followed by receiving information that causes a TAPC state progression to a Capture_xR state via the Update-xR state through one or more states of a test access port controller (TAPC) in each of the first branch and second branch.]

[11. The method of claim 10, wherein performing shift operations comprises receiving a sequence of selection events and selection sequences by the plurality of branches to sequentially select a respective branch, followed by TAPC state progressions that include the Shift-xR state, with this TAPC state progression followed by one or more chip level test access ports (CLTAPCs) in the selected branch.]

[12. A digital system, comprising:

a plurality of components, each having a test access port (TAP) configured to perform diagnostic tests on the associated component in response to commands presented to the TAPs, the TAPs of the plurality of components connected to form a complex scan topology having two or more branches, the complex scan topology configured to couple to the source of commands;

wherein a first branch and a second branch have different test access port technologies, and wherein the first branch is configured to respond to a first protocol to perform shift operations while the second branch is in an offline mode, and the second branch is configured to respond to a different second protocol to perform shift operations while the first branch is in an offline mode; and wherein the first branch and the second branch are configured to respond to a common protocol to perform capture and update operations in parallel.]

13. [The digital system of claim 12, wherein] *A digital system, comprising:*

*a plurality of components, each having a test access port (TAP) configured to perform diagnostic tests on the*

*associated component in response to commands presented to the TAPs, the TAPs of the plurality of components connected to form a complex scan topology having two or more branches, the complex scan topology configured to couple to the source of commands,* each TAP of the plurality of components comprises:

a test clock (TCK) input and a test mode select (TMS) input configured to receive test signals from a source of commands a TAP scan path having one or more bits, the TAP scan path connected to a test data input (TDI) and a test data output (TDO), wherein the TDI and TDO are configured to be coupled to a scan path of the complex scan topology;

a topology register, programmable when the TAP can be deployed in multiple scan topologies and hard-wired to a value when the TAP can be deployed in a single scan topology, coupled to control logic, wherein the topology register records the topology type in which the TAPC is deployed, selectable as part of a Series Scan Topology when the Topology Register indicates the TAP.7 controller is deployed in a Series Scan Topology, selectable as part of a Series Scan Topology when the Topology Register indicates the TAP.7 controller is deployed in a Series Scan Topology, selectable as part of a [Star2-Scan] *Star-2 Scan* Topology when the Topology Register indicates the TAP.7 controller is deployed in a Star-2 Scan Topology, Selectable independent of the Topology Register value when the selection criteria specifies any TAP.7 Scan topology Series, Star-4, and [Star-2)] *Star-2;* and the control logic coupled to the TCK(C) and TMS(C) inputs and configured to detect a selection event and an selection criteria received on the TMS(C) input, and further configured to place the TAP controller (the ADTAPC) in an online mode when the selection criteria matches a topology type identified by the Topology Register value*; and*

*a first branch and a second branch have different test access port technologies, the first branch configured to respond to a first protocol to perform shift operations while the second branch is in an offline mode, and the second branch configured to respond to a different second protocol to perform shift operations while the first branch is in an offline mode.*

14. The digital system of claim 13, wherein the selection event and the selection criteria are received together serially.

15. The digital system of claim 13, wherein the control logic is further configured to receive and detect a sequence of bit values prior to receiving the selection event which determine whether the selection event initiates a selection sequence.

16. The digital system of claim 13, wherein the control logic is further configured to place the TAP controller in an offline mode when the selection criteria does not match the activation criteria.

17. The digital system of claim 13, wherein the selection event specifies a specific technology of a complex scan topology by selecting a series, a Star-4, a Star-2, all of the series, Star-4 and Star-2 topologies, or another technology.

*18. The method of claim 7, further comprising performing capture and update operations in the second branch of the complex scan topology in parallel with capture and update operations in the first branch.*

*19. The method of claim 8, further comprising performing capture and update operations in the second branch of the complex scan topology in parallel with capture and update operations in the first branch.*

*20. The method of claim 9, further comprising performing capture and update operations in the second branch of the complex scan topology in parallel with capture and update operations in the first branch.*

*21. The system of claim 13, wherein the first branch and the second branch are configured to respond to a common protocol to perform capture and update operations in parallel.*

* * * * *